(12) United States Patent
Tseng et al.

(10) Patent No.: US 11,929,125 B2
(45) Date of Patent: Mar. 12, 2024

(54) WINDOW PROGRAM VERIFY TO REDUCE DATA LATCH USAGE IN MEMORY DEVICE

(71) Applicant: SanDisk Technologies LLC, Addison, TX (US)

(72) Inventors: Tai-Yuan Tseng, Milpitas, CA (US); Chia-Kai Chou, San Jose, CA (US); Iris Lu, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 153 days.

(21) Appl. No.: 17/355,615

(22) Filed: Jun. 23, 2021

(65) Prior Publication Data

US 2022/0415415 A1 Dec. 29, 2022

(51) Int. Cl.
*G11C 16/34* (2006.01)
*G11C 7/06* (2006.01)
*G11C 16/10* (2006.01)
*G11C 16/24* (2006.01)
*G11C 16/26* (2006.01)

(52) U.S. Cl.
CPC .......... *G11C 16/3459* (2013.01); *G11C 7/065* (2013.01); *G11C 16/102* (2013.01); *G11C 16/24* (2013.01); *G11C 16/26* (2013.01)

(58) Field of Classification Search
CPC .. G11C 7/00; G11C 7/06; G11C 7/065; G11C 16/0483; G11C 16/06; G11C 16/10; G11C 16/102; G11C 16/24; G11C 16/26; G11C 16/3459
See application file for complete search history.

(56) References Cited

U.S. PATENT DOCUMENTS

| | | | |
|---|---|---|---|
| 7,957,197 B2 | 6/2011 | Nguyen et al. | |
| 9,552,882 B2 | 1/2017 | Tseng et al. | |
| 9,748,001 B2 | 8/2017 | Li et al. | |
| 9,792,995 B1 * | 10/2017 | Shah | G11C 7/1039 |
| 10,043,558 B2 | 8/2018 | Shah et al. | |
| 10,121,522 B1 | 11/2018 | Tseng et al. | |
| 10,366,729 B2 | 7/2019 | Tseng et al. | |
| 10,971,202 B1 | 4/2021 | Chen et al. | |
| 10,971,240 B1 * | 4/2021 | Dunga | G11C 16/344 |
| 2015/0221391 A1 * | 8/2015 | Tseng | G11C 16/10 365/185.22 |
| 2020/0381052 A1 * | 12/2020 | Hioka | G11C 16/26 |

OTHER PUBLICATIONS

U.S. Appl. No. 17/188,998, filed Mar. 1, 2021.

* cited by examiner

*Primary Examiner* — Alfredo Bermudez Lozada
(74) *Attorney, Agent, or Firm* — Vierra Magen Marcus LLP

(57) ABSTRACT

Apparatuses and techniques are described for reducing the number of latches used in sense circuits for a memory device. The number of internal user data latches in a sense circuit is reduced by using an external data transfer latch to store a bit of user data, in place of an internal user data latch. The user data in the data transfer latches identifies a subset of the data states which are not prohibited from having a verify test. The subset is shifted as the program operation proceeds, at specified program loops, to encompass higher data states. The completion of programming by a memory cell is indicated by the user data latches and another internal latch of the sense circuit in place of the external data transfer latch.

20 Claims, 23 Drawing Sheets

| Latch: | Er | A | B | C | D | E | F | G |
|---|---|---|---|---|---|---|---|---|
| XDL | 0 | 0 | 0 | 0 | 1 | 1 | 1 | 1 |
| ADL | 1 | 0 | 1 | 0 | 0 | 1 | 0 | 1 |
| BDL | 1 | 0 | 0 | 1 | 0 | 0 | 1 | 1 |
| TDL | 1 | 0 | 0 | 0 | 0 | 0 | 0 | 0 |

1400

Fig. 1A
Prior Art
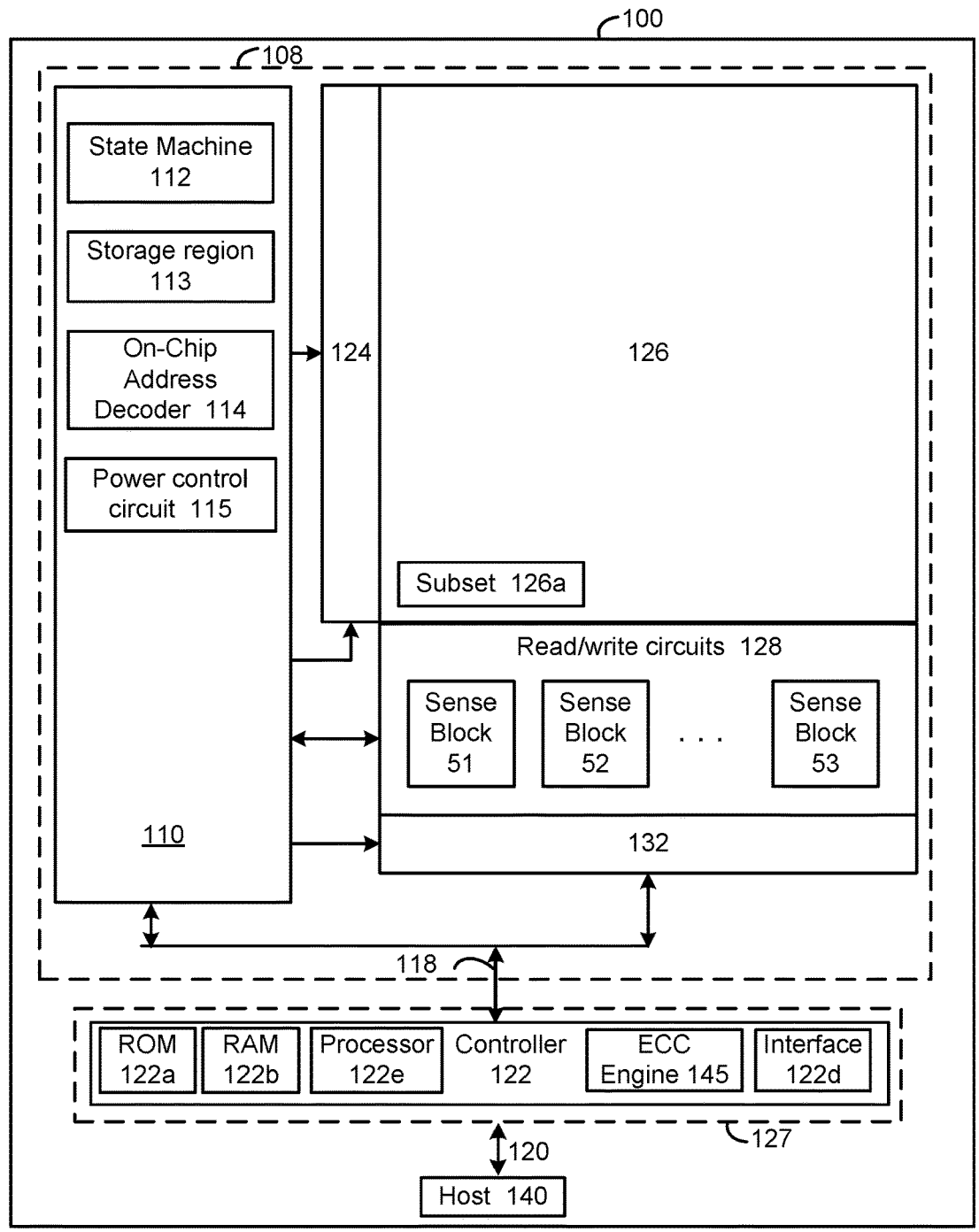
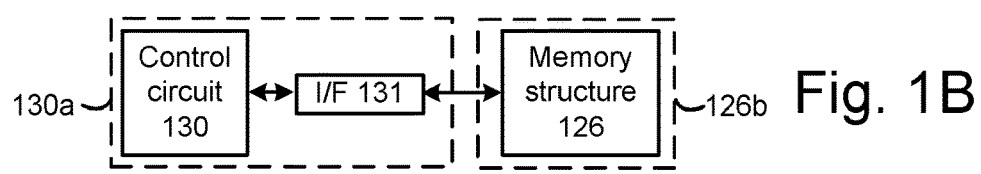
Fig. 1B

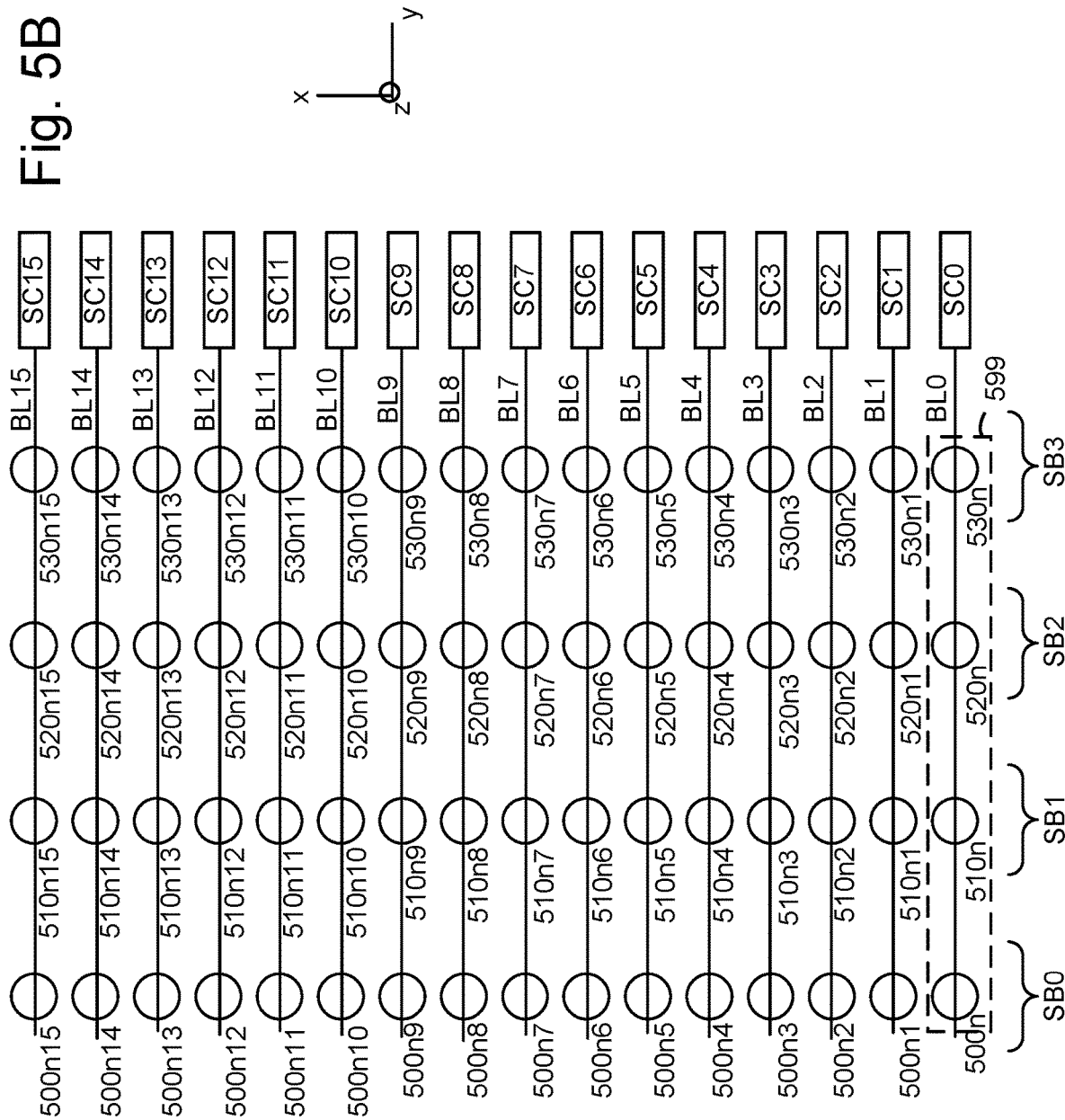

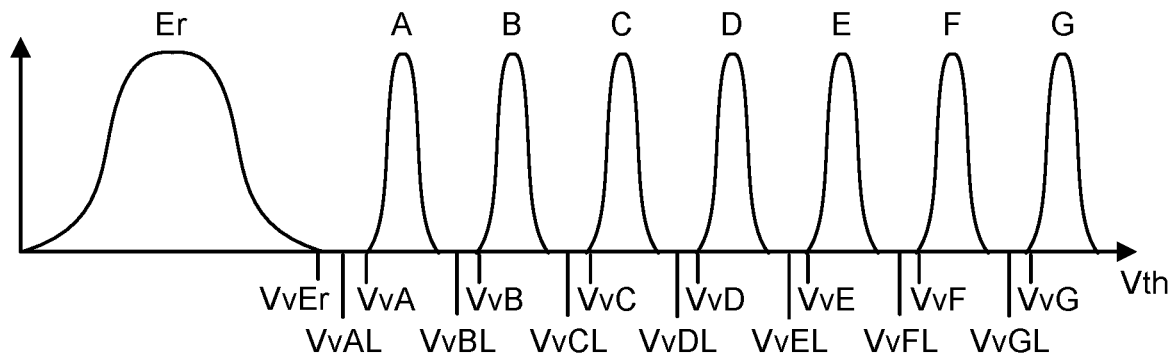

Fig. 8A
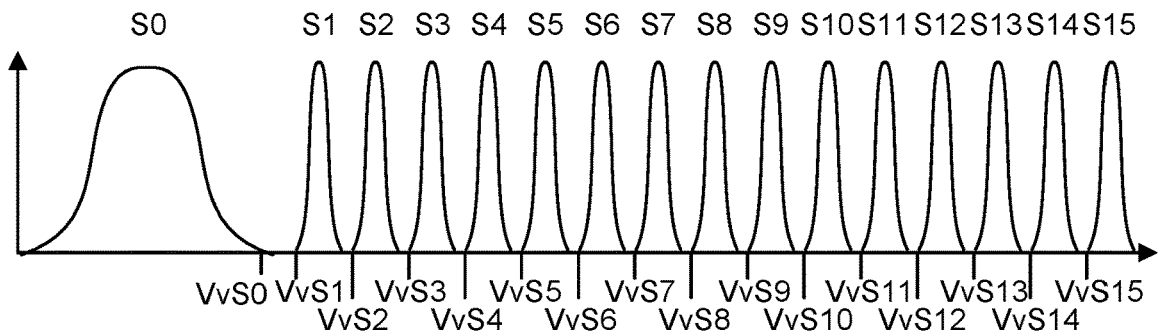
Fig. 8B
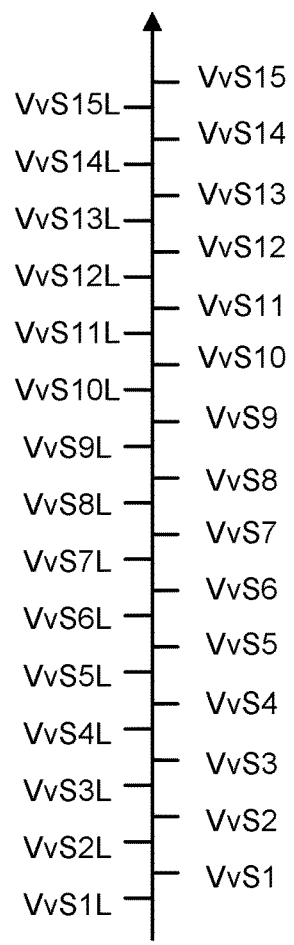
Fig. 8C
| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| ADL | 1 | 0 | 0 | 1 | 1 | 1 | 1 | 0 | 0 | 0 | 0 | 1 | 1 | 1 | 0 | 0 |
| BDL | 1 | 1 | 0 | 0 | 0 | 1 | 1 | 1 | 1 | 0 | 0 | 0 | 0 | 1 | 1 | 0 |
| CDL | 1 | 1 | 1 | 1 | 0 | 0 | 0 | 0 | 0 | 0 | 0 | 0 | 1 | 1 | 1 | 1 |
| DDL | 1 | 1 | 1 | 1 | 1 | 1 | 0 | 0 | 1 | 1 | 0 | 0 | 0 | 0 | 0 | 0 |

| State | PL for verify |
|---|---|
| S1 | 1-5 |
| S2 | 3-7 |
| S3 | 5-9 |
| S4 | 7-11 |
| S5 | 9-13 |
| S6 | 11-15 |
| S7 | 13-17 |
| S8 | 15-19 |
| S9 | 17-21 |
| S10 | 19-23 |
| S11 | 21-25 |
| S12 | 23-27 |
| S13 | 25-29 |
| S14 | 27-31 |
| S15 | 29-33 |

1400

| Latch: | Er | A | B | C | D | E | F | G |
|---|---|---|---|---|---|---|---|---|
| XDL | 0 | 0 | 0 | 0 | 1 | 1 | 1 | 1 |
| ADL | 1 | 0 | 1 | 0 | 0 | 1 | 0 | 1 |
| BDL | 1 | 0 | 0 | 1 | 0 | 0 | 1 | 1 |
| TDL | 1 | 0 | 0 | 0 | 0 | 0 | 0 | 0 |

Fig. 14A

| Latch: | Er | A | B | C | D | E | F | G |
|---|---|---|---|---|---|---|---|---|
| XDL | 0 | 0 | 0 | 0 | 0 | 1 | 1 | 1 |
| ADL | 1 | 1 | 1 | 0 | 0 | 1 | 0 | 1 |
| BDL | 1 | 1 | 0 | 1 | 0 | 0 | 1 | 1 |
| TDL | 1 | 1 | 0 | 0 | 0 | 0 | 0 | 0 |

Fig. 14B

| Latch: | Er | A | B | C | D | E | F | G |
|---|---|---|---|---|---|---|---|---|
| XDL | 0 | 0 | 0 | 0 | 0 | 0 | 1 | 1 |
| ADL | 1 | 1 | 1 | 0 | 0 | 1 | 0 | 1 |
| BDL | 1 | 1 | 1 | 1 | 0 | 0 | 1 | 1 |
| TDL | 1 | 1 | 1 | 0 | 0 | 0 | 0 | 0 |

Fig. 14C

| Latch: | Er | A | B | C | D | E | F | G |
|---|---|---|---|---|---|---|---|---|
| XDL | 0 | 0 | 0 | 0 | 0 | 0 | 0 | 1 |
| ADL | 1 | 1 | 1 | 1 | 0 | 1 | 0 | 1 |
| BDL | 1 | 1 | 1 | 1 | 0 | 0 | 1 | 1 |
| TDL | 1 | 1 | 1 | 1 | 0 | 0 | 0 | 0 |

Fig. 14D

| Latch: | Er | A | B | C | D | E | F | G |
|---|---|---|---|---|---|---|---|---|
| XDL | 0 | 0 | 0 | 0 | 0 | 0 | 0 | 0 |
| ADL | 1 | 1 | 1 | 1 | 1 | 1 | 0 | 1 |
| BDL | 1 | 1 | 1 | 1 | 1 | 0 | 1 | 1 |
| TDL | 1 | 1 | 1 | 1 | 1 | 0 | 0 | 0 |

Fig. 14E

| Latch: | Er | A | B | C | D | E | F | G |
|---|---|---|---|---|---|---|---|---|
| XDL | 0 | 0 | 0 | 0 | 0 | 0 | 0 | 0 |
| ADL | 1 | 1 | 1 | 1 | 1 | 1 | 0 | 1 |
| BDL | 1 | 1 | 1 | 1 | 1 | 1 | 1 | 1 |
| TDL | 1 | 1 | 1 | 1 | 1 | 1 | 0 | 0 |

Fig. 14F

| Latch: | Er | A | B | C | D | E | F | G |
|---|---|---|---|---|---|---|---|---|
| XDL | 0 | 0 | 0 | 0 | 0 | 0 | 0 | 0 |
| ADL | 1 | 1 | 1 | 1 | 1 | 1 | 1 | 1 |
| BDL | 1 | 1 | 1 | 1 | 1 | 1 | 1 | 1 |
| TDL | 1 | 1 | 1 | 1 | 1 | 1 | 1 | 0 |

Fig. 14G

| Latch: | Er | A | B | C | D | E | F | G |
|---|---|---|---|---|---|---|---|---|
| XDL | 0 | 0 | 0 | 0 | 0 | 0 | 0 | 0 |
| ADL | 1 | 1 | 1 | 1 | 1 | 1 | 1 | 1 |
| BDL | 1 | 1 | 1 | 1 | 1 | 1 | 1 | 1 |
| TDL | 1 | 1 | 1 | 1 | 1 | 1 | 1 | 1 |

| Latch: | Er | A | B | C | D | E | F | G |
|---|---|---|---|---|---|---|---|---|
| XDL | 0 | 0 | 0 | 0 | 1 | 1 | 1 | 1 |
| ADL | 1 | 0 | 1 | 0 | 0 | 1 | 0 | 1 |
| BDL | 1 | 0 | 0 | 1 | 0 | 0 | 1 | 1 |
| TDL | 1 | 0 | 0 | 0 | 0 | 0 | 0 | 0 |

| Latch: | Er | A | B | C | D | E | F | G |
|---|---|---|---|---|---|---|---|---|
| XDL | 0 | 0 | 0 | 0 | 0 | 0 | 1 | 1 |
| ADL | 1 | 1 | 1 | 0 | 0 | 1 | 0 | 1 |
| BDL | 1 | 1 | 0 | 1 | 0 | 0 | 1 | 1 |
| TDL | 1 | 1 | 0 | 0 | 0 | 0 | 0 | 0 |

Fig. 14B1

| Latch: | Er | A | B | C | D | E | F | G |
|---|---|---|---|---|---|---|---|---|
| XDL | 0 | 0 | 0 | 0 | 0 | 0 | 0 | 1 |
| ADL | 1 | 1 | 1 | 0 | 0 | 1 | 0 | 1 |
| BDL | 1 | 1 | 1 | 1 | 0 | 0 | 1 | 1 |
| TDL | 1 | 1 | 1 | 0 | 0 | 0 | 0 | 0 |

Fig. 14C1

| Latch: | Er | A | B | C | D | E | F | G |
|---|---|---|---|---|---|---|---|---|
| XDL | 0 | 0 | 0 | 0 | 0 | 0 | 0 | 0 |
| ADL | 1 | 1 | 1 | 1 | 0 | 1 | 0 | 1 |
| BDL | 1 | 1 | 1 | 1 | 0 | 0 | 1 | 1 |
| TDL | 1 | 1 | 1 | 1 | 0 | 0 | 0 | 0 |

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 1 | 1 | 1 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |

Fig. 15B

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 1 | 1 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 1 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 1 | 0 | 0 | 0 | 0 | 0 | 0 | 0 | 0 | 0 | 0 | 0 | 0 | 0 | 0 |

Fig. 15C

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 1 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 0 | 1 | 0 | 1 | 0 | 1 | 0 | 0 | 1 | 0 | 1 | 0 | 1 |
| TDL | 1 | 1 | 1 | 0 | 0 | 0 | 0 | 0 | 0 | 0 | 0 | 0 | 0 | 0 | 0 | 0 |

Fig. 15D

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 1 | 1 | 0 | 1 | 0 | 1 | 0 | 0 | 1 | 0 | 1 | 0 | 1 |
| TDL | 1 | 1 | 1 | 1 | 0 | 0 | 0 | 0 | 0 | 0 | 0 | 0 | 0 | 0 | 0 | 0 |

Fig. 15E

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 1 | 1 | 1 | 1 |
| ADL | 1 | 1 | 1 | 1 | 1 | 0 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 1 | 1 | 0 | 1 | 0 | 1 | 0 | 0 | 1 | 0 | 1 | 0 | 1 |
| TDL | 1 | 1 | 1 | 1 | 1 | 0 | 0 | 0 | 0 | 0 | 0 | 0 | 0 | 0 | 0 | 0 |

Fig. 15F

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 1 | 1 | 1 |
| ADL | 1 | 1 | 1 | 1 | 1 | 1 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 1 | 1 | 1 | 1 | 0 | 1 | 0 | 0 | 1 | 0 | 1 | 0 | 1 |
| TDL | 1 | 1 | 1 | 1 | 1 | 1 | 0 | 0 | 0 | 0 | 0 | 0 | 0 | 0 | 0 | 0 |

Fig. 15G

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 1 | 1 |
| ADL | 1 | 1 | 1 | 1 | 1 | 1 | 1 | 0 | 1 | 1 | 1 | 0 | 0 | 0 | 0 | 1 |
| BDL | 1 | 1 | 1 | 1 | 1 | 1 | 1 | 0 | 0 | 0 | 1 | 1 | 1 | 0 | 0 | 1 |
| CDL | 1 | 1 | 1 | 1 | 1 | 1 | 1 | 0 | 1 | 0 | 0 | 1 | 0 | 1 | 0 | 1 |
| TDL | 1 | 1 | 1 | 1 | 1 | 1 | 1 | 0 | 0 | 0 | 0 | 0 | 0 | 0 | 0 | 0 |

Fig. 15H

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 1 |
| ADL | 1 | 1 | 1 | 1 | 1 | 1 | 1 | 1 | 1 | 1 | 1 | 0 | 0 | 0 | 0 | 1 |
| BDL | 1 | 1 | 1 | 1 | 1 | 1 | 1 | 1 | 0 | 0 | 1 | 1 | 1 | 0 | 0 | 1 |
| CDL | 1 | 1 | 1 | 1 | 1 | 1 | 1 | 1 | 1 | 0 | 0 | 1 | 0 | 1 | 0 | 1 |
| TDL | 1 | 1 | 1 | 1 | 1 | 1 | 1 | 1 | 0 | 0 | 0 | 0 | 0 | 0 | 0 | 0 |

Fig. 15I

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 0 | 0 | 0 | 0 | 1 |
| BDL | 1 | 1 | 1 | 1 | 1 | 1 | 1 | 1 | 1 | 0 | 1 | 1 | 1 | 0 | 0 | 1 |
| CDL | 1 | 1 | 1 | 1 | 1 | 1 | 1 | 1 | 1 | 0 | 0 | 1 | 0 | 1 | 0 | 1 |
| TDL | 1 | 1 | 1 | 1 | 1 | 1 | 1 | 1 | 1 | 0 | 0 | 0 | 0 | 0 | 0 | 0 |

Fig. 15J

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 0 | 0 | 0 | 0 | 1 |
| BDL | 1 | 1 | 1 | 1 | 1 | 1 | 1 | 1 | 1 | 1 | 1 | 1 | 1 | 0 | 0 | 1 |
| CDL | 1 | 1 | 1 | 1 | 1 | 1 | 1 | 1 | 1 | 1 | 0 | 1 | 0 | 1 | 0 | 1 |
| TDL | 1 | 1 | 1 | 1 | 1 | 1 | 1 | 1 | 1 | 1 | 0 | 0 | 0 | 0 | 0 | 0 |

Fig. 15K

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 0 | 0 | 0 | 0 | 1 |
| BDL | 1 | 1 | 1 | 1 | 1 | 1 | 1 | 1 | 1 | 1 | 1 | 1 | 1 | 0 | 0 | 1 |
| CDL | 1 | 1 | 1 | 1 | 1 | 1 | 1 | 1 | 1 | 1 | 1 | 1 | 0 | 1 | 0 | 1 |
| TDL | 1 | 1 | 1 | 1 | 1 | 1 | 1 | 1 | 1 | 1 | 1 | 0 | 0 | 0 | 0 | 0 |

Fig. 15L

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 1 | 0 | 0 | 0 | 1 |
| BDL | 1 | 1 | 1 | 1 | 1 | 1 | 1 | 1 | 1 | 1 | 1 | 1 | 1 | 0 | 0 | 1 |
| CDL | 1 | 1 | 1 | 1 | 1 | 1 | 1 | 1 | 1 | 1 | 1 | 1 | 1 | 0 | 1 | 0 | 1 |
| TDL | 1 | 1 | 1 | 1 | 1 | 1 | 1 | 1 | 1 | 1 | 1 | 1 | 0 | 0 | 0 | 0 |

Fig. 15M

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 1 | 1 | 0 | 0 | 1 |
| BDL | 1 | 1 | 1 | 1 | 1 | 1 | 1 | 1 | 1 | 1 | 1 | 1 | 1 | 0 | 0 | 1 |
| CDL | 1 | 1 | 1 | 1 | 1 | 1 | 1 | 1 | 1 | 1 | 1 | 1 | 1 | 1 | 0 | 1 |
| TDL | 1 | 1 | 1 | 1 | 1 | 1 | 1 | 1 | 1 | 1 | 1 | 1 | 1 | 0 | 0 | 0 |

Fig. 15N

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 1 | 1 | 1 | 0 | 1 |
| BDL | 1 | 1 | 1 | 1 | 1 | 1 | 1 | 1 | 1 | 1 | 1 | 1 | 1 | 1 | 0 | 1 |
| CDL | 1 | 1 | 1 | 1 | 1 | 1 | 1 | 1 | 1 | 1 | 1 | 1 | 1 | 1 | 0 | 1 |
| TDL | 1 | 1 | 1 | 1 | 1 | 1 | 1 | 1 | 1 | 1 | 1 | 1 | 1 | 1 | 0 | 0 |

Fig. 15O

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 1 | 1 | 1 | 1 | 1 |
| BDL | 1 | 1 | 1 | 1 | 1 | 1 | 1 | 1 | 1 | 1 | 1 | 1 | 1 | 1 | 1 | 1 |
| CDL | 1 | 1 | 1 | 1 | 1 | 1 | 1 | 1 | 1 | 1 | 1 | 1 | 1 | 1 | 1 | 1 |
| TDL | 1 | 1 | 1 | 1 | 1 | 1 | 1 | 1 | 1 | 1 | 1 | 1 | 1 | 1 | 1 | 0 |

Fig. 15P

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 0 | 0 | 0 | 1 | 1 |
| BDL | 1 | 1 | 1 | 1 | 1 | 1 | 1 | 1 | 1 | 1 | 1 | 1 | 1 | 0 | 1 | 1 |
| CDL | 1 | 1 | 1 | 1 | 1 | 1 | 1 | 1 | 1 | 1 | 1 | 1 | 1 | 1 | 1 | 1 |
| TDL | 1 | 1 | 1 | 1 | 1 | 1 | 1 | 1 | 1 | 1 | 1 | 1 | 1 | 1 | 1 | 1 |

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 1 | 1 | 1 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 1 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 1 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 1 | 0 | 0 | 0 | 0 | 0 | 0 | 0 | 0 | 0 | 0 | 0 | 0 | 0 | 0 |

Fig. 15C1

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 1 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 0 | 1 | 0 | 1 | 0 | 1 | 0 | 0 | 1 | 0 | 1 | 0 | 1 |
| TDL | 1 | 1 | 1 | 0 | 0 | 0 | 0 | 0 | 0 | 0 | 0 | 0 | 0 | 0 | 0 | 0 |

Fig. 15D1

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 1 | 1 | 1 | 1 |
| ADL | 1 | 1 | 1 | 1 | 0 | 0 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 1 | 1 | 0 | 1 | 0 | 1 | 0 | 0 | 1 | 0 | 1 | 0 | 1 |
| TDL | 1 | 1 | 1 | 1 | 0 | 0 | 0 | 0 | 0 | 0 | 0 | 0 | 0 | 0 | 0 | 0 |

Fig. 15E1

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 1 | 1 | 1 |
| ADL | 1 | 1 | 1 | 1 | 1 | 0 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 1 | 1 | 0 | 1 | 0 | 1 | 0 | 0 | 1 | 0 | 1 | 0 | 1 |
| TDL | 1 | 1 | 1 | 1 | 1 | 0 | 0 | 0 | 0 | 0 | 0 | 0 | 0 | 0 | 0 | 0 |

Fig. 15F1

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 1 | 1 |
| ADL | 1 | 1 | 1 | 1 | 1 | 1 | 0 | 0 | 1 | 1 | 1 | 0 | 0 | 0 | 0 | 1 |
| BDL | 1 | 1 | 1 | 1 | 1 | 1 | 0 | 0 | 0 | 0 | 1 | 1 | 1 | 0 | 0 | 1 |
| CDL | 1 | 1 | 1 | 1 | 1 | 1 | 1 | 0 | 1 | 0 | 0 | 1 | 0 | 1 | 0 | 1 |
| TDL | 1 | 1 | 1 | 1 | 1 | 1 | 0 | 0 | 0 | 0 | 0 | 0 | 0 | 0 | 0 | 0 |

Fig. 15G1

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 1 |
| ADL | 1 | 1 | 1 | 1 | 1 | 1 | 1 | 0 | 1 | 1 | 1 | 0 | 0 | 0 | 0 | 1 |
| BDL | 1 | 1 | 1 | 1 | 1 | 1 | 1 | 0 | 0 | 0 | 1 | 1 | 1 | 0 | 0 | 1 |
| CDL | 1 | 1 | 1 | 1 | 1 | 1 | 1 | 0 | 1 | 0 | 0 | 1 | 0 | 1 | 0 | 1 |
| TDL | 1 | 1 | 1 | 1 | 1 | 1 | 1 | 0 | 0 | 0 | 0 | 0 | 0 | 0 | 0 | 0 |

Fig. 15H1

| Latch: | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 0 | 0 | 0 | 0 | 0 | 0 | 0 | 0 | 0 | 0 | 0 | 0 | 0 | 0 | 0 | 0 |
| ADL | 1 | 1 | 1 | 1 | 1 | 1 | 1 | 1 | 1 | 1 | 1 | 0 | 0 | 0 | 0 | 1 |
| BDL | 1 | 1 | 1 | 1 | 1 | 1 | 1 | 1 | 0 | 0 | 1 | 1 | 1 | 0 | 0 | 1 |
| CDL | 1 | 1 | 1 | 1 | 1 | 1 | 1 | 1 | 1 | 0 | 0 | 1 | 0 | 1 | 0 | 1 |
| TDL | 1 | 1 | 1 | 1 | 1 | 1 | 1 | 1 | 0 | 0 | 0 | 0 | 0 | 0 | 0 | 0 |

Fig. 16A

| PL | Window position |
|---|---|
| 1-4 | initial |
| 5 | shift (after A state completes) |
| 8 | shift (after B state completes) |
| 10 | shift (after C state completes) |
| 12 | shift (after D state completes) |

Fig. 16B

| PL | Window position |
|---|---|
| 1-5 | initial |
| 6 | shift (after S1 state completes) |
| 8 | shift (after S2 state completes) |
| 10 | shift (after S3 state completes) |
| 12 | shift (after S4 state completes) |
| 14 | shift (after S5 state completes) |
| 16 | shift (after S6 state completes) |
| 18 | shift (after S7 state completes) |

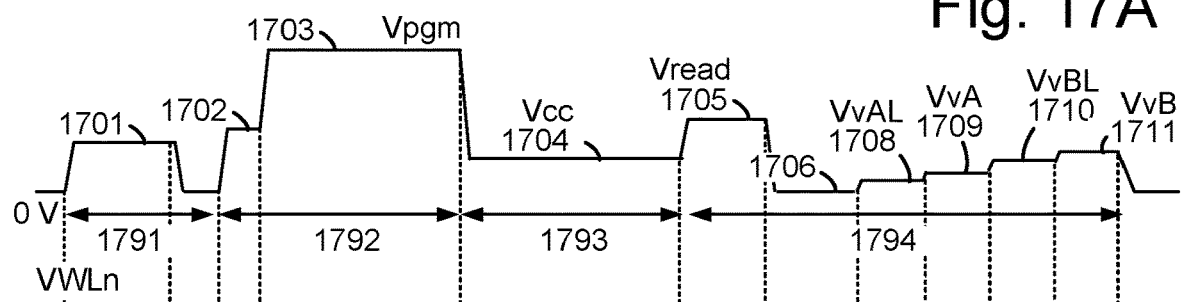
Fig. 17A
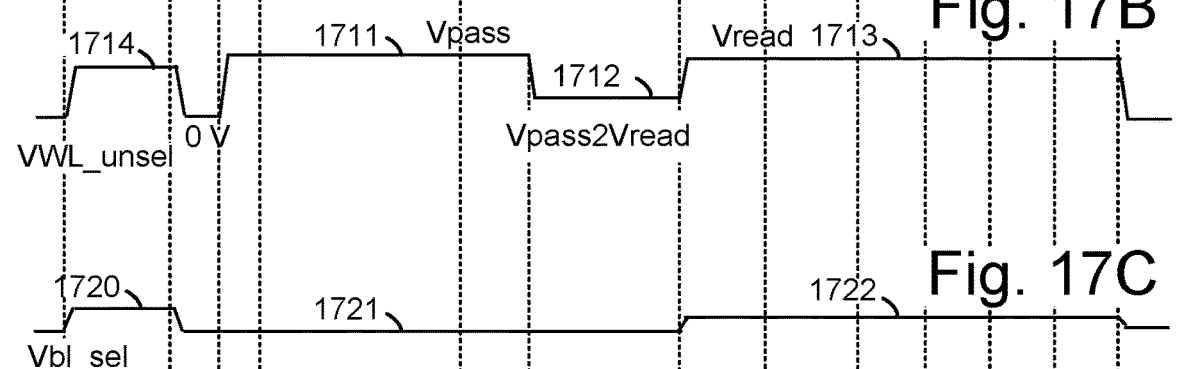
Fig. 17B
Fig. 17C
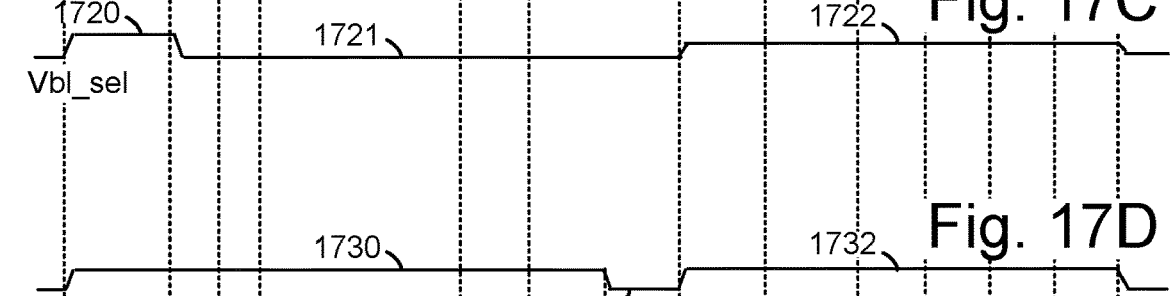
Fig. 17D
Fig. 17E
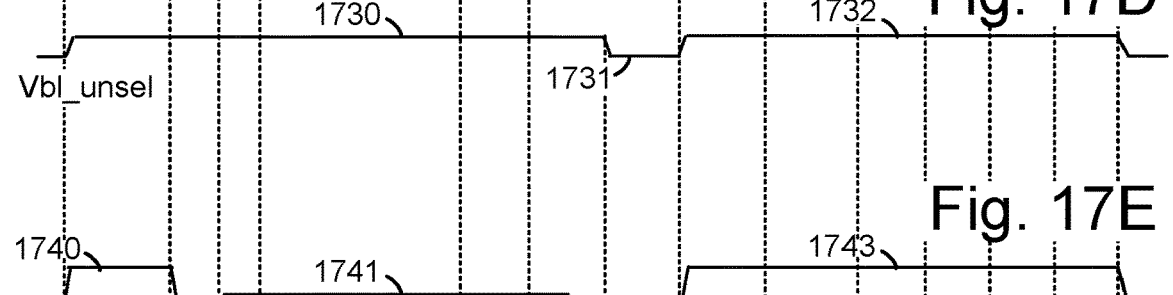
Fig. 17F
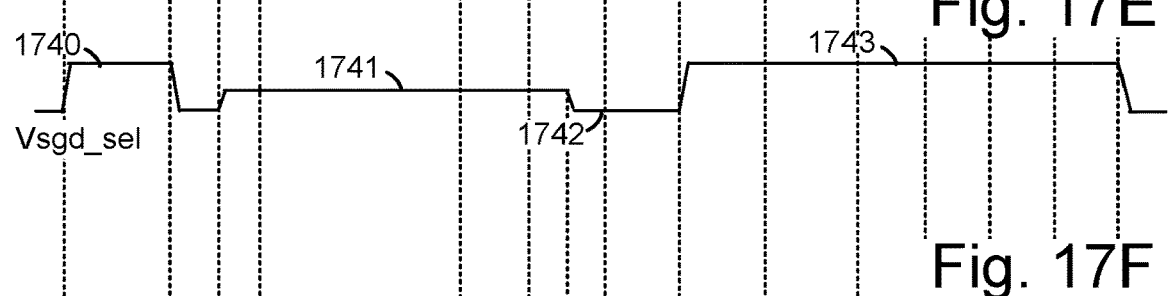
Fig. 17G
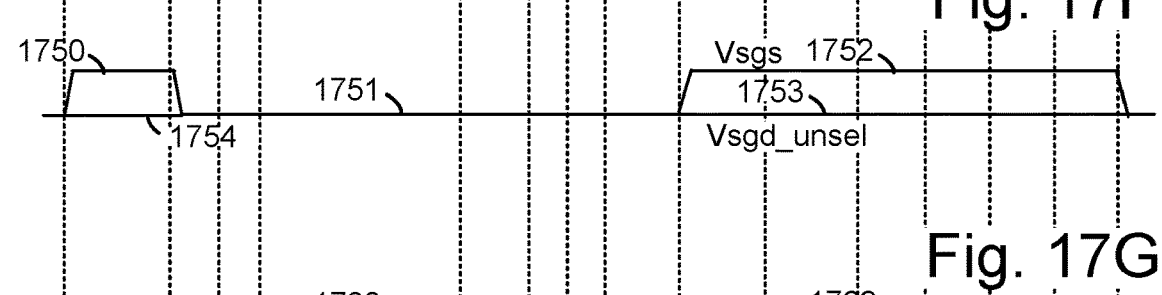

WINDOW PROGRAM VERIFY TO REDUCE DATA LATCH USAGE IN MEMORY DEVICE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130*a* communicates with the memory structure 126 on a separate second die 126*b*.

FIG. 4 depicts an example cross-sectional view of a portion of BLK0 of FIG. 3A, including NAND strings 500*n* and 510*n*, in a single-tier stack.

FIG. 5B depicts an example top view of BLK0 of FIG. 5A, with respective NAND strings, bit lines and sense circuits.

FIG. 7A depicts Vth distributions for a set of memory cells in an eight-state memory device.

FIG. 7B depicts example user data for the eight data states in FIG. 7A.

FIG. 7C depicts an example correspondence between data states and program loops (PL) in which verify tests are performed, consistent with FIG. 7A.

FIG. 8A depicts Vth distributions for a set of memory cells in a sixteen-state memory device.

FIG. 8B depicts lower and higher verify voltages consistent with FIG. 8A.

FIG. 8C depicts example user data for the sixteen data states in FIG. 8A.

FIG. 14A depicts example user data at the start of a program operation in an eight-state memory device, including a window encompassing a subset of data states A-C.

FIG. 14B depicts the example user data of FIG. 14A after the A state completes programming, where the window is shifted to encompass a subset of data states B-D.

FIG. 14C depicts the example user data of FIG. 14A after the B state completes programming, where the window is shifted to encompass a subset of data states C-E.

FIG. 14D depicts the example user data of FIG. 14A after the C state completes programming, where the window is shifted to encompass a subset of data states D-F.

FIG. 14E depicts the example user data of FIG. 14A after the D state completes programming, where the window is shifted to encompass a subset of data states E-G.

FIG. 14F depicts the example user data of FIG. 14A after the E state completes programming, where the window continues to encompass a subset of data states E-G.

FIG. 14G depicts the example user data of FIG. 14A after the F state completes programming, where the window continues to encompass a subset of data states E-G.

FIG. 14H depicts the example user data of FIG. 14A after the G state completes programming, where the window continues to encompass a subset of data states E-G.

FIG. 14A1 depicts example user data at the start of a program operation in an eight-state memory device, including a window encompassing a subset of data states A-C.

FIG. 14B1 depicts the example user data of FIG. 14A after the A state completes programming, where the window is shifted to encompass a subset of data states B-E.

FIG. 14C1 depicts the example user data of FIG. 14A after the B state completes programming, where the window is shifted to encompass a subset of data states C-F.

FIG. 14D1 depicts the example user data of FIG. 14A after the C state completes programming, where the window is shifted to encompass a subset of data states D-G.

FIG. 15A depicts example user data at the start of a program operation in a sixteen-state memory device, including a window encompassing a subset of data states S1-S7.

FIG. 15B depicts the example user data of FIG. 15A after the S1 state completes programming, where the window is shifted to encompass a subset of data states S2-S8.

FIG. 15C depicts the example user data of FIG. 15A after the S2 state completes programming, where the window is shifted to encompass a subset of data states S3-S9.

FIG. 15D depicts the example user data of FIG. 15A after the S3 state completes programming, where the window is shifted to encompass a subset of data states S4-S10.

FIG. 15E depicts the example user data of FIG. 15A after the S4 state completes programming, where the window is shifted to encompass a subset of data states S5-S11.

FIG. 15F depicts the example user data of FIG. 15A after the S5 state completes programming, where the window is shifted to encompass a subset of data states S6-S12.

FIG. 15G depicts the example user data of FIG. 15A after the S6 state completes programming, where the window is shifted to encompass a subset of data states S7-S13.

FIG. 15H depicts the example user data of FIG. 15A after the S7 state completes programming, where the window is shifted to encompass a subset of data states S8-S14.

FIG. 15I depicts the example user data of FIG. 15A after the S8 state completes programming, where the window is shifted to encompass a subset of data states S9-S15.

FIG. 15J depicts the example user data of FIG. 15A after the S9 state completes programming, where the window continues to encompass a subset of data states S9-S15.

FIG. 15K depicts the example user data of FIG. 15A after the S10 state completes programming, where the window continues to encompass a subset of data states S9-S15.

FIG. 15L depicts the example user data of FIG. 15A after the S11 state completes programming, where the window continues to encompass a subset of data states S9-S15.

FIG. 15M depicts the example user data of FIG. 15A after the S12 state completes programming, where the window continues to encompass a subset of data states S9-S15.

FIG. 15N depicts the example user data of FIG. 15A after the S13 state completes programming, where the window continues to encompass a subset of data states S9-S15.

FIG. 15O depicts the example user data of FIG. 15A after the S14 state completes programming, where the window continues to encompass a subset of data states S9-S15.

FIG. 15P depicts the example user data of FIG. 15A after the S15 state completes programming, where the window continues to encompass a subset of data states S9-S15.

FIG. 15A1 depicts example user data at the start of a program operation in a sixteen-state memory device, including a window encompassing a subset of data states S1-S7.

FIG. 15B1 depicts the example user data of FIG. 15A after the S1 state completes programming, where the window is shifted to encompass a subset of data states S2-S9.

FIG. 15C1 depicts the example user data of FIG. 15A after the S2 state completes programming, where the window is shifted to encompass a subset of data states S3-S10.

FIG. 15D1 depicts the example user data of FIG. 15A after the S3 state completes programming, where the window is shifted to encompass a subset of data states S4-S11.

FIG. 15E1 depicts the example user data of FIG. 15A after the S4 state completes programming, where the window is shifted to encompass a subset of data states S5-S12.

FIG. 15F1 depicts the example user data of FIG. 15A after the S5 state completes programming, where the window is shifted to encompass a subset of data states S6-S13.

FIG. 15G1 depicts the example user data of FIG. 15A after the S6 state completes programming, where the window is shifted to encompass a subset of data states S7-S14.

FIG. 15H1 depicts the example user data of FIG. 15A after the S7 state completes programming, where the window is shifted to encompass a subset of data states S8-S15.

FIG. 16A depicts an example schedule of specified program loops in which a shift in a window occurs, consistent with the three-bit per cell examples of FIGS. 7C, 14A-14H and 14A1-14D1.

FIG. 16B depicts an example schedule of specified program loops in which a shift in a window occurs, consistent with the four-bit per cell examples of FIGS. 8D, 15A-15P and 15A1-15H1.

FIG. 17A depicts voltages applied to a selected word line, WLn in a program loop of a program operation, consistent with FIG. 9.

FIG. 17B depicts a voltage, VWL_unsel, applied to unselected word lines, consistent with FIG. 17A.

FIG. 17C depicts a voltage, Vbl_sel, applied to bit lines of programmed NAND strings, consistent with FIG. 17A.

FIG. 17D depicts a voltage, Vbl_unsel, applied to bit lines of unselected NAND strings, consistent with FIG. 17A.

FIG. 17E depicts a voltage, Vsgd_sel, applied to SGD transistors of a selected sub-block, consistent with FIG. 17A.

FIG. 17F depicts voltages applied to SGD transistors of unselected sub-blocks and to SGS transistors, consistent with FIG. 17A.

FIG. 17G depicts a voltage applied to a source line, consistent with FIG. 17A.

DETAILED DESCRIPTION

Figure 2:
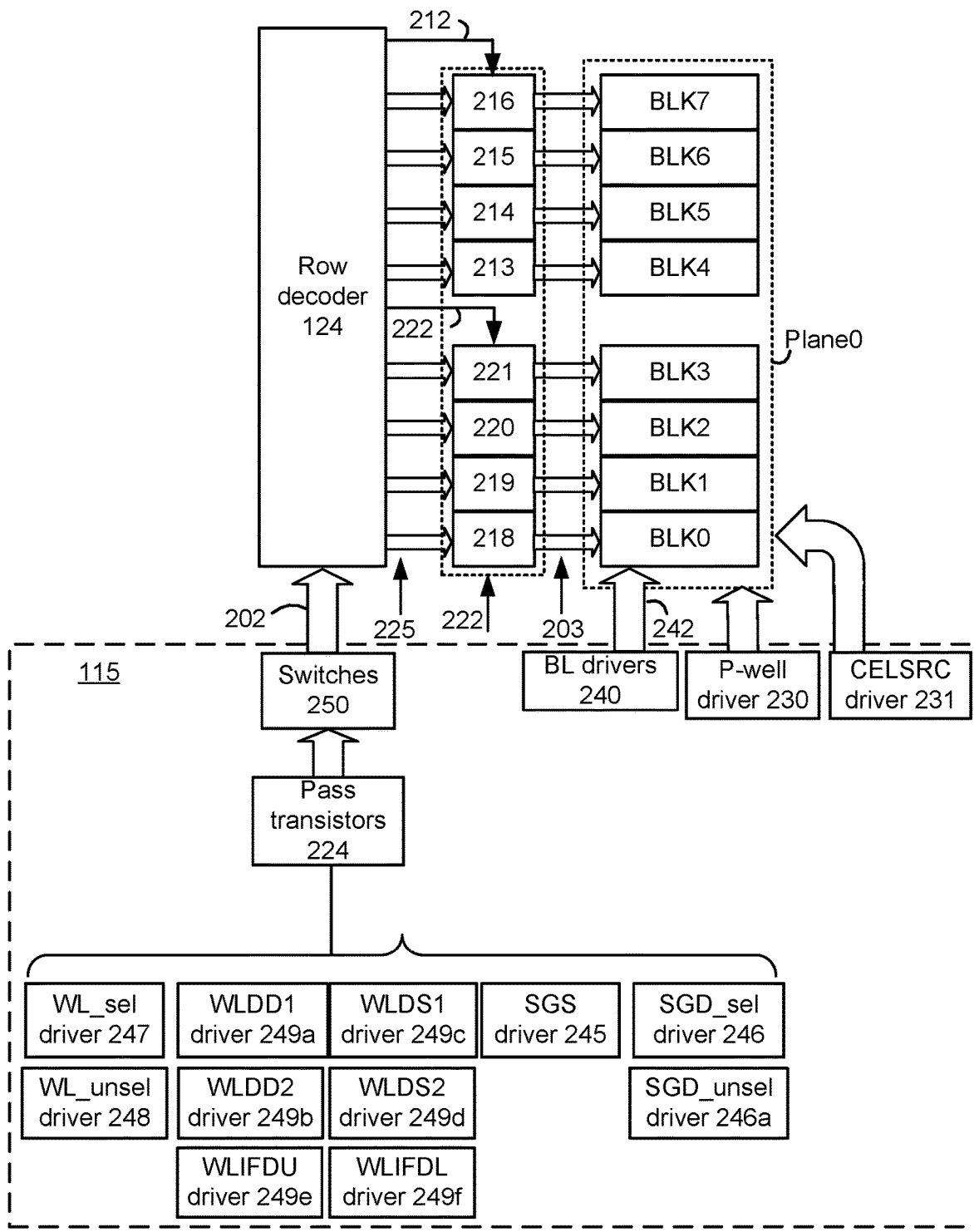
FIG. 2 depicts an example implementation of the power control circuit 115 of FIG. 1A for providing voltages to blocks of memory cells.

Apparatuses and techniques are described for reducing the number of latches used in sense circuits for a memory device.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

Data can be stored in the memory cells by programming them to different data states which are represented by different ranges of threshold voltages (Vths). For high density storage, multiple bits of data are stored in each memory cell. Typically, data is stored in units of pages, with one bit per cell per page.

Each memory cell may be associated with an assigned data state according to write data, or user data, in a program command. Based on its data state, a memory cell will either remain in the erased state or be programmed to a programmed data state. For example, in a three-bit per cell memory device, there are eight data states including the erased state Er and seven higher data states A, B, C, D, E, F and G. In a four-bit per cell memory device, there are sixteen data states including the erased state S0 and fifteen higher data states S1-S15.

When a program command is issued, the user data is stored in user data latches in a sense circuit of each memory cells. For example, a data transfer latch may be used to input the user data from a control circuit to internal user data latches of a sense circuit. The user data latches are updated to identify an inhibit state when a memory cell completes programming.

During programming, a series of program loops or program-verify iterations are performed. Each program loop includes a program portion in which a program pulse is applied to a set of memory cells such as via a respective selected word line, followed by a verify portion. When a program pulse is applied, a bit line voltage is set based on the user data latches to allow or inhibit programming. In the verify portion, the user data latches are read, or scanned, to determine the assigned data state to which the cell is to be programmed. Each programmed data state is associated with a verify voltage such that a memory cell with a given data state is considered to have completed programming when a sensing operation determines its threshold voltage (Vth) is above the associated verify voltage. A verify test, or sensing operation, can then be performed to determine whether a memory cell has a Vth above the associated verify voltage. The verify test involves applying the associated verify voltage to the control gate and sensing a current through the memory cell, such as can be indicated by a voltage at a sense node in the sense circuit. If the voltage discharges to a relatively low level, this indicates the memory cell is in a conductive state, such that the Vth is less than the control gate voltage, and the memory cell does not pass the verify test. If the voltage remains at a relatively high level, this indicates the memory cell is in a non-conductive state, such that the Vth is above the control gate voltage, and the memory cell passes the verify test.

The verify voltage which is used to determine that a memory cell has completed programming may be referred to as a lockout or high verify voltage in a lockout verify test, since it results in locking out or inhibiting the memory cell from further programming. In some cases, an additional, offset or low verify voltage may be used in an offset verify test to determine that a memory cell is close to completion of the programming. When a memory cell passes the offset verify test but not the lockout verify test, its programming speed can be reduced in the next program loop by elevating a voltage of a respective bit line when the program pulse is applied. By slowing the programming speed just before a memory cell completes programming, narrower Vth distributions can be achieved.

However, there is a continuing desire to increase the storage density of memory cells, scaled down the memory device and reduce program time.

Techniques provided herein address the above and other issues. In one aspect, the number of user data latches in a sense circuit is reduced by using an external data transfer latch of a sense circuit to store a bit of user data, in place of an internal user data latch. The user data in the data transfer latches is set based on a subset or window of the data states which are not prohibited from having a verify test. The subset is shifted as the program operation proceeds to encompass higher data states. For example, a bit value of 0 may be set for each data state in the subset, while a bit value of 1 is set for each data state above the subset. When an additional state is encompassed by the subset, its bit is flipped from 1 to 0, for example. The first bit value indicates a data state not prohibited from having a verify test and the second bit value indicates a data state prohibited from having a verify test, in a given program loop. A schedule can be defined for shifting the subset at specified program loops of a program operation.

Additionally, a schedule can be defined of data states to be verified in each program loop. Typically, these data states include fewer than all data states in the subset.

During the verify portion of a program loop, memory cells are identified for which a verify test is to be performed.

In one approach, there are N data states and M bits per cell, and the subset has N/2−1 or N/2 data states. Generally, the subset can include no more than half of the data states. Further, there are M−1 internal user data latches in the sense circuit, where N=$2^m$. A set of bits of user data which defines the assigned state of a memory cell has M bits, and for each sense circuit, one of these bits is loaded into the respective data transfer latch and M−1 of these bits, e.g., the remaining bits of user data, are loaded into M−1 respective internal user data latches, one bit per internal user data latch. Thus, the number of internal user data latches is reduced from M to M−1.

Additional internal latches in the sense circuit can include SDL, which is used to set a bit line voltage and sense node voltage according to whether a verify test will be performed, and TDL, which is used to indicate whether a verify test is passed.

By defining a subset of consecutive data states having a common bit value in the respective data transfer latch, accessing of the respective data transfer latch is minimized. Further, the respective data transfer latch can be replaced by TDL in determining whether programming is completed for a memory cell. In particular, scanning of TDL in combination with the internal user data latches indicates whether programming is completed for a respective memory cell. Program time is reduced since the scan time of the internal latches is faster than for the data transfer latch.

The techniques can be used when one or more verify tests are performed for a data state. For example, a single lockout verify test can be performed using a lockout verify voltage, or both offset and lockout verify tests can be performed. When both offset and lockout verify tests are performed, the data transfer latch can be accessed once, at a start of the verify tests, resulting in a further time savings.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114 and a power control circuit 115.

In one embodiment, the state machine is programmable by operational parameters and software/code stored in the storage region 113. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122*e*, memory such as ROM 122*a* and RAM 122*b* and an error-correction code (ECC) engine 145. The ECC engine can correct a number of read errors. The RAM 122*b* can be a DRAM which stores non-committed data, for example. During programming, a copy of the data to be programmed is stored in the RAM 122*b* until the programming is successfully completed. In response to the successful completion, the data is erased from the RAM 122*b* and is said to be committed or released to the block of memory cells. The RAM 122*b* may store user data for memory cells of one or more word lines. One approach to erasing data involves marking the data for a garbage collection process.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The memory in the controller 122, such as such as ROM 122*a* and RAM 122*b*, comprises code such as a set of instructions, and the processor is operable to execute the set of instructions to provide the functionality described herein. Alternatively, or additionally, the processor can access code from a subset 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*e* fetches the boot code from the ROM 122*a* or the subset 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 6. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular, and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130*a* communicates with the memory structure 126 on a separate second die 126*b*. The control circuit may communicate with the memory structure and the die 126*b* via a memory interface 131, for example, similar to the memory interface 122*d*. Examples of a memory interface (I/F) include the Common Flash Memory Interface of JEDEC. The techniques described herein can be implemented with a control die 130*a* bonded to one or more memory die 126*b*, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 2 to provide the voltage signals described herein and to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 depicts an example implementation of the power control circuit 115 of FIG. 1A for providing voltages to blocks of memory cells. The circuitry shown can be repeated for each plane of a die, in one approach. In this example, the memory structure 126 includes a set of eight blocks, BLK0-BLK7, in a plane, Plane0, consistent with FIG. 3. Generally, the blocks can be in one or more planes. The row decoder 124 of FIG. 1A provides voltages to word lines and select gate control lines of each block via a set of pass transistors 222. In one approach, a separate row decoder is provided for each block. The row decoder can be provided one side of a block, and provides a control signal to pass transistors which connect the blocks to the row decoder. Further, the blocks can be arranged in groups, where the pass transistors of each set of blocks in a group are controlled by a common control gate voltage. A first group includes BLK0-BLK3 and a second group includes BLK4-BLK7. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, in the first group, a control gate line 222 is connected to sets of pass transistors 218-221, which in turn are connected to control gate lines of BLK0-BLK3, respectively. In a second group, a control gate line 212 is connected to sets of pass transistors 213-216, which in turn are connected to control gate lines of BLK4-BLK7, respectively.

Typically, program or read operations are performed on one selected sub-block at a time in a block. An erase operation may be performed on a selected block or sub-block. The row decoder can connect global control lines 202 to post-switch, local control lines 203 via pre-switch control lines 225 and the set of pass transistors (switches) 222. The control lines represent conductive paths. Voltages can be provided on the global control lines from a one or more voltage drivers. Some of the voltage drivers may provide voltages to switches 250 which connect to the global control lines. Pass transistors 224 are controlled to pass voltages from the voltage drivers to the switches 250.

A number of voltage drivers can be provided that are connected to the pass transistors. For example, a selected data word line driver, WL_sel driver 247, provides a voltage signal on a data word line which is selected during a program or read operation.

The WL_unsel driver 248 provides a voltage signal on unselected data word lines. This voltage driver can be used to apply a voltage pulse to all word lines of one or more blocks in a word line voltage refresh operation, or to unselected word lines in a block in a read operation. In one approach, a single WL_unsel driver can apply the voltage pulse to word lines of one or more blocks at a given time on a chip by controlling the row decoders to either pass or block the voltage pulse.

A number of drivers for dummy word lines can also be provided. For example, WLDD1, WLDD2, WLDS1, WLDS2, WLIFDU and WLIFDL drivers 249a-249f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 245 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 246 for the SGD transistors of a selected sub-block of a block involved in an operation, and a SGD_unsel driver 246a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 230 provides a voltage Vp-well to the p+ contact 612b in a p-well region of the substrate, where the p-well region is common to a set of blocks. A set of bit lines is also shared by the blocks. A source line voltage driver, referred to as a CELSRC driver 231, provides a voltage Vcelsrc to a source end of a NAND string. For example, Vcelsrc can be provided to an n+ contact in the p-well region.

Bit line (BL) voltage drivers 240 include voltage sources which provide voltages to the bit lines. The bit line voltage for sensing can be 0.5 V, for example.

Figure 3:
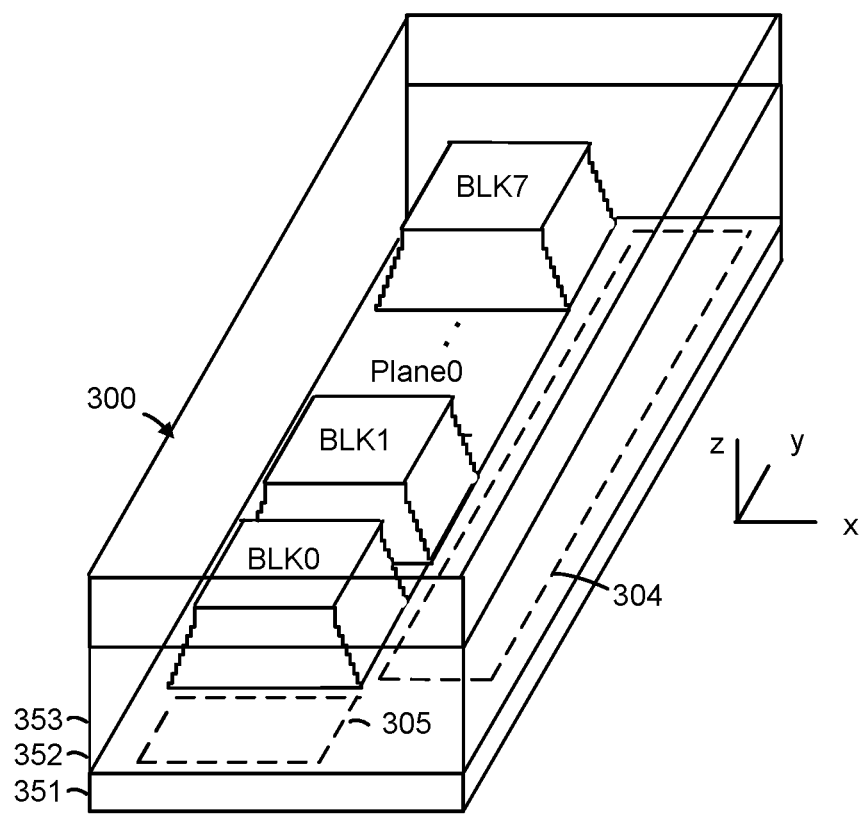
FIG. 3 is a perspective view of a memory device 300 comprising the blocks BLK0-BLK7 of FIG. 2 in an example 3D configuration.

FIG. 3 is a perspective view of a memory device 300 comprising the blocks BLK0-BLK7 of FIG. 2 in an example 3D configuration. The substrate 351 includes a plane, Plane0, on which the example blocks BLK0-BLK7 of memory cells (storage elements) are formed. Peripheral areas with circuitry for use by the blocks are also formed on the substrate. The peripheral area 304 extends along a long edge of the plane, while the peripheral area 305 extends along a short edge of the plane. The circuitry can include voltage drivers which can be connected to control gate layers, bit lines and source lines of the blocks. In one approach, control gate layers at a common height in the blocks are commonly driven. The substrate 351 can also carry circuitry under the blocks, and one or more lower metal layers which are patterned in conductive paths to carry signals of the circuitry. The blocks are formed in an intermediate region 352 of the memory device. In an upper region 353 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While eight blocks are depicted as an example, typically there are many more blocks extending in the x- and/or y-directions, in one or more planes.

In this example, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. When the blocks are in multiple planes, a separate set of bit lines may be used for each plane.

In a stacked memory device, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
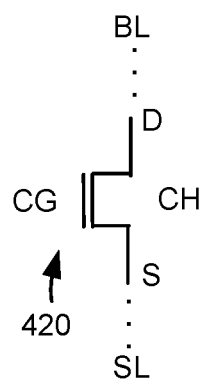
FIG. 4 depicts an example transistor 420 in the memory structure 126 of FIG. 1A.

FIG. 4 depicts an example transistor 420 in the memory structure 126 of FIG. 1A. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string.

Figure 5A:
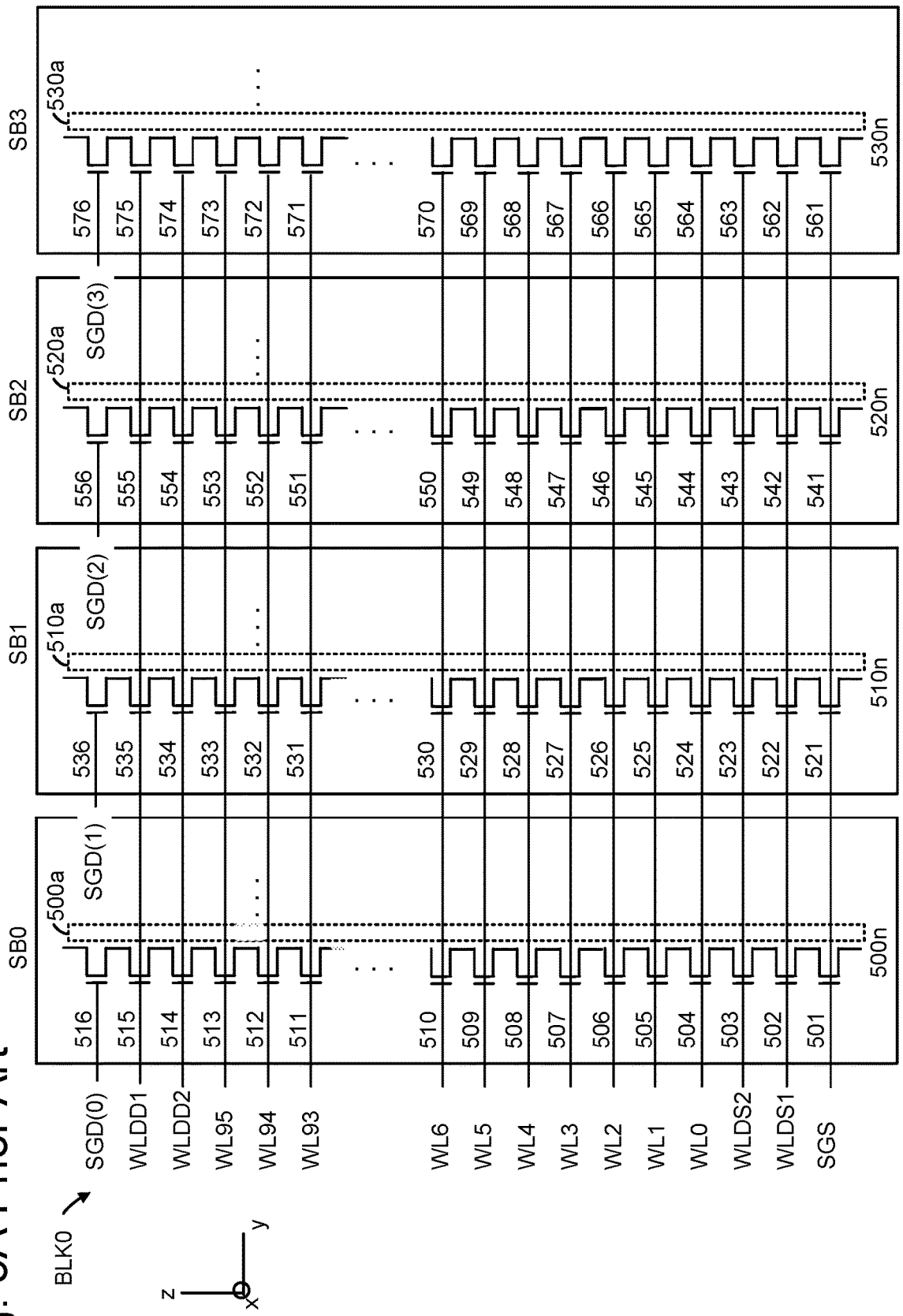
FIG. 5A depicts an example view of NAND strings in BLK0 which is consistent with FIG. 3.

FIG. 5A depicts an example view of NAND strings in BLK0 which is consistent with FIG. 3. The NAND strings are arranged in sub-blocks of the block in a 3D configuration. Each sub-block includes multiple NAND strings, where one example NAND string is depicted. For example, SB0, SB1, SB2 and SB3 comprise example NAND strings 500*n*, 510*n*, 520*n* and 530*n*, respectively. The NAND strings have data word lines, dummy word lines and select gate lines. Each sub-block comprises a set of NAND strings which extend in the x direction and which have a common SGD line or control gate layer.

The NAND strings 500*n*, 510*n*, 520*n* and 530*n* have channels 500*a*, 510*a*, 520*a* and 530*a*, respectively. Additionally, NAND string 500*n* includes SGS transistor 501, source-side dummy memory cells 502 and 503, data memory cells 504-513, drain-side dummy memory cells 514 and 515 and SGD transistor 516. NAND string 510*n* includes SGS transistor 521, source-side dummy memory cells 522 and 523, data memory cells 524-533, drain-side dummy memory cells 534 and 535 and SGD transistor 536. NAND string 520*n* includes SGS transistor 541, source-side dummy memory cells 542 and 543, data memory cells 544-553, drain-side dummy memory cells 554 and 555 and SGD transistor 556. NAND string 530*n* includes SGS transistor 561, source-side dummy memory cells 562 and 563, data memory cells 564-573, drain-side dummy memory cell 574 and 575 and SGD transistor 576.

In a 3D configuration, the NAND strings can extend vertically upwards from a substrate and be connected at their top ends to a common set of bit lines. The NAND strings are formed in a stack of alternating conductive layers (word line layers) and dielectric layers.

The conductive layers comprise SGS, WLDS1, WLDS2, WL0-WL95, WLDD2, WLDD1 and SGD(0). In this example, the stack includes ninety-six data word lines, WL0-WL95.

The NAND strings are formed by etching memory holes in the stack, then depositing multiple thin layers of materials along the sidewalls of the memory holes. Memory cells are formed in a region in which the word lines intersect with the multiple thin layers and select gate transistors are formed in regions in which the SGS and SGD control lines intersect with the multiple thin layers. For example, the layers can include a blocking oxide layer, a charge-trapping layer, e.g., silicon nitride, a tunnel oxide layer and a channel layer, e.g., polysilicon. A dielectric core, e.g., silicon dioxide, can also be provided. A word line or control line can comprise a metal such as Tungsten.

FIG. 5B depicts an example top view of BLK0 of FIG. 5A, with respective NAND strings, bit lines and sense circuits. The view is in the x-y plane. Each circle represents a NAND string. In this example, sixteen NAND strings per sub-block are depicted. SB0 includes the NAND string 500*n* of FIG. 5A and additional NAND strings 500*n*1-500*n*15. SB1 includes the NAND string 510*n* of FIG. 5A and additional NAND strings 510*n*1-510*n*15. SB2 includes the NAND string 520*n* of FIG. 5A and additional NAND strings 520*n*1-520*n*15. SB3 includes the NAND string 530*n* of FIG. 5A and additional NAND strings 530*n*1-530*n*15.

A set of bit lines BL0-BL15 are connected to the NAND strings. Each bit line is connected to a respective set of NAND strings, including one NAND string in each sub-block. For example, BL0 is connected to NAND strings 500*n*, 510*n*, 520*n* and 530*n* in a set of NAND strings 599, BL1 is connected to NAND strings 500*n*1, 510*n*1, 520*n*1 and 530*n*1, and so forth. Each bit line is also connected to a respective sense circuit. For example, BL0-BL15 are connected to sense circuits SC0-SC15, respectively.

Figure 6:
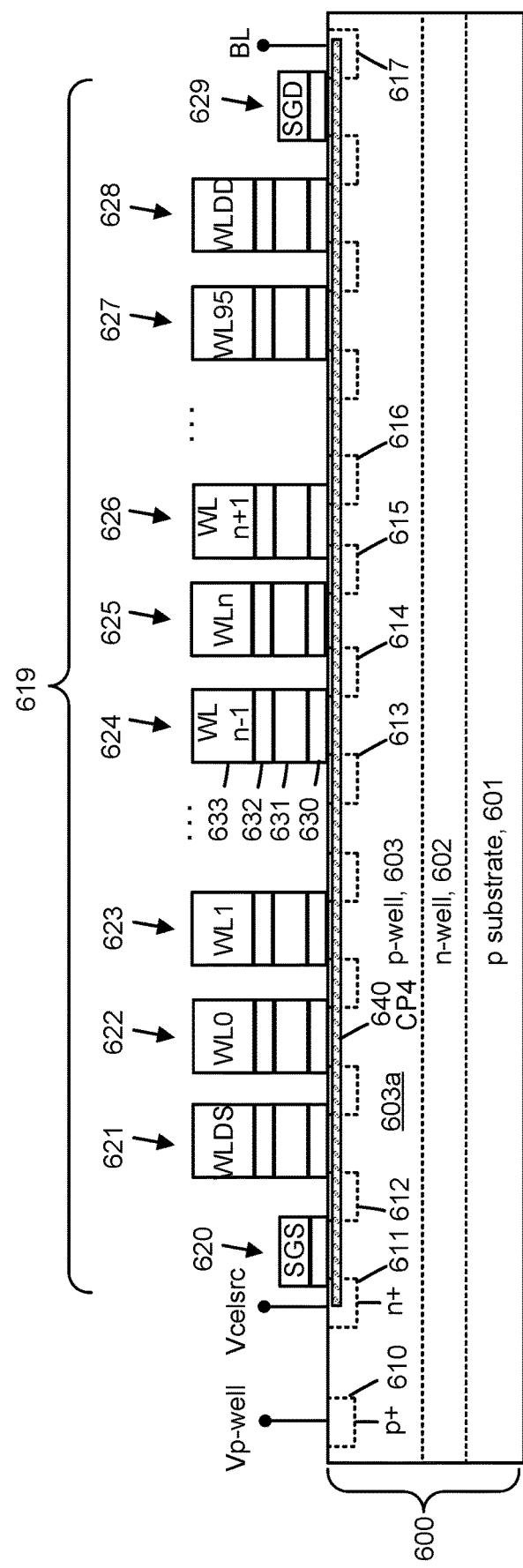
FIG. 6 depicts an example NAND string in a 2D configuration.

FIG. 6 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 600 includes a p-well 603 within an n-well 602, which in turn is in a p substrate 601. Vp-well and Vcelsrc are provided to the p-well via contacts 610 and 611, respectively. The contact 611 is a source line. The erase pulse can be Vp-well. A NAND string 619 is arranged on the substrate and include select gate transistors and memory cells. For example, the NAND string includes a SGS transistor 620, memory cells 621, 622 and 623 connected to WLDS, WL0 and WL1, respectively, memory cells 624, 625 and 626 connected to WLn−1, WLn and WLn+1, respectively, memory cells 627 and 628 connected to WL95 and WLDD, respectively, and a SGD transistor 629. Doped regions in the substrate, such as example doped regions 611-617, act as sources and drains of the transistors. Vbl is provided to the doped region 617. When appropriate voltages are provided to the NAND string, an inversion layer or channel 640 is formed in the p-well. A remaining portion 603a of the p-well is biased at Vp-well.

The example memory cell 624 comprises a tunnel oxide layer 630, a floating gate layer 631, a blocking oxide layer 632 and a control gate 633.

FIG. 7A depicts Vth distributions for a set of memory cells in an eight-state memory device. The Vth distributions are for an erased state (Er) and programmed states A-G. State A is the lowest programmed state and state G is the highest programmed state. Initially, the memory cells of a block are erased to the Er distribution. An erase-verify test is performed by sensing the memory cells while applying a verify voltage VvEr to the word lines. In a program operation, multiple program loops, or program-verify iterations, are performed. The memory cells assigned to the A-G states are subject to verify tests using VvA-VvG, respectively. These are final or lockout verify voltages. Optionally, the memory cells assigned to the A-G states are also subject to verify tests using the verify voltages VvAL-VvGL, respectively. These are offset or low verify voltages.

As mentioned at the outset, the low verify voltages can be used to slow the programming speed just before a memory cell completes programming, resulting in narrower Vth distributions.

The Vth distributions can be achieved in a program operation which involves one or more program passes, where each pass uses a separate series of increasing voltage pulses. In one approach, referred to as foggy-fine programming, a first, foggy program pass uses the low verify voltages and a second, fine program pass uses the lockout verify voltages. It is also possible to use both the low and lockout verify voltages in a single program pass in a technique referred to as quick pass write.

FIG. 7B depicts example user data for the eight data states in FIG. 7A. The assigned data state of a memory cell can be defined by a set of three bits of user data when there are eight data states. In this example, ADL, BDL and CDL are the internal user data latches of a sense circuit and store bits for upper, middle and lower pages, respectively. In this example, ADL/BDL/CDL=1/1/1, 1/1/0, 1/O/0, 0/0/0, 0/1/0, 0/1/1, 0/0/1 and 1/0/1 for the Er-G states, respectively. Various encodings are possible. Each state has a different set of bits to uniquely identify it.

FIG. 7C depicts an example correspondence between data states and program loops (PL) in which verify tests are performed, consistent with FIG. 7A. As mentioned, a schedule can be defined of a correspondence between program loop number and the data states to verify. Generally, the lower, mid-range and upper data states are verified in the earlier, mid-range and later program loops, respectively, of a program operation. As some data states complete programming, new data states are subject to verify tests. The schedule can be optimized based on tests, for example. In one option, the program loop at which a verify test for a data state is first performed and the program loop at which the verify test for the data state is last performed, are both fixed by the schedule. In another option, the program loop at which a verify test for a data state is first performed is fixed by the schedule, and the program loop at which the verify test for the data state is last performed is variable and based on when the memory cells pass the verify test.

In this example, the verify tests for the A-G states are performed in program loops 1-4, 3-7, 5-9, 7-11, 9-13, 11-15 and 13-17, respectively. Typically, in a given PL, verify tests for one or more data states can be performed. For example, in PL=5, verify tests for the B and C data states are performed.

This example requires an internal data latch for each bit of user data. In the techniques discussed herein, the number of internal data latches can be reduced. Or, equivalently, the number of bits per cell and data states can be increased without increasing the number of internal data latches.

FIG. 8A depicts Vth distributions for a set of memory cells in a sixteen-state memory device. The Vth distributions are for an erased state (S0) and programmed states S1-S15. State S1 is the lowest programmed state and state S15 is the highest programmed state. Initially, the memory cells of a block are erased to the Er distribution using a verify voltage VvS0. In a program operation, the memory cells assigned to the S1-S15 states are subject to verify tests using VvS1-VvS15, respectively. These are final or lockout verify voltages. Optionally, the memory cells assigned to the S1-515 states are also subject to verify tests using the low or offset verify voltages VvS1L-VvS15L, respectively, as depicted in FIG. 8B.

As before, the Vth distributions can be achieved in a program operation which involves one or more program passes.

FIG. 8B depicts lower and higher verify voltages consistent with FIG. 8A. For the S1-S15 states, the lower verify voltages are VvS1L-VvS15L, respectively, and the higher verify voltages are VvS1-VvS15, respectively. Each low verify voltage is offset below the corresponding high or lockout verify voltage. The offset can be the same or different for the different data states.

FIG. 8C depicts example user data for the sixteen data states in FIG. 8A. The assigned data state of a memory cell can be defined by a set of four bits of user data when there are sixteen data states. In this example, ADL, BDL, CDL and DDL are the internal user data latches of a sense circuit and store bits for lower, middle, upper and top pages, respectively. In this example, ADL/BDL/CDL/DDL=1/1/1/ 1, 0/1/1/1, 0/0/1/1, 1/0/1/1, 1/0/0/1, 1/1/0/1, 1/1/0/0, 0/1/0/0, 0/1/0/1, 0/0/0/1, 0/0/0/0, 1/0/0/0, 1/0/1/0, 1/1/1/0, 0/1/1/0, 0/0/1/0 for the S1-S15 states, respectively. Each state has a different set of bits to uniquely identify it.

Figures 8D, 9:
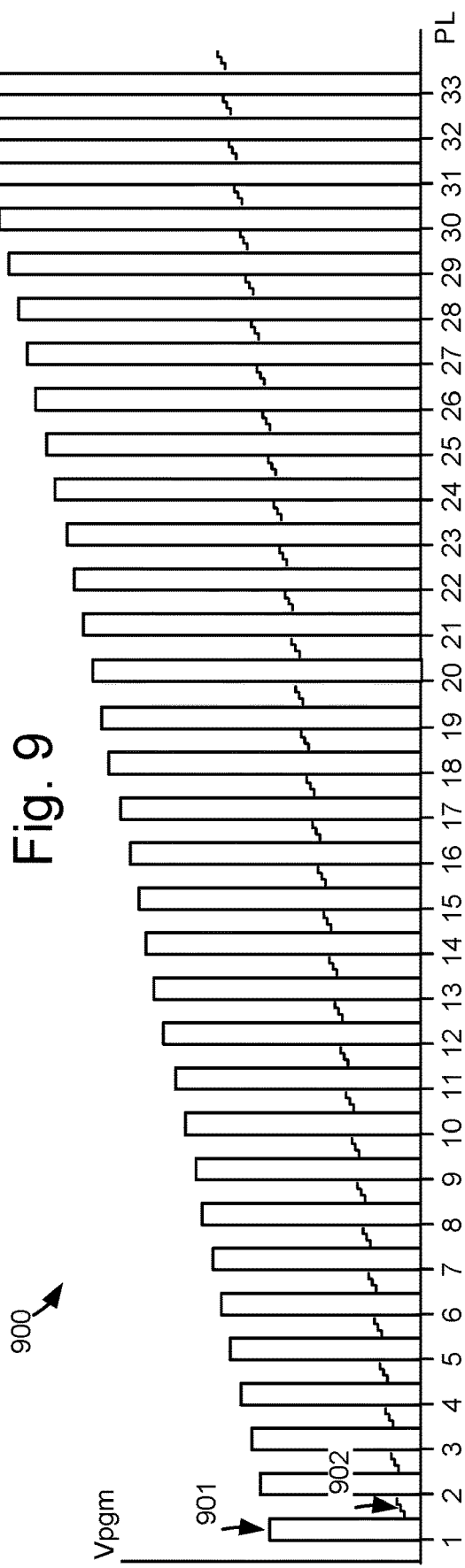
FIG. 8D depicts an example correspondence between data states and program loops (PL) in which verify tests are performed, consistent with FIG. 8A.
FIG. 9 depicts an example voltage signal 900 in a program operation, consistent with FIG. 8D.

FIG. 8D depicts an example correspondence between data states and program loops (PL) in which verify tests are performed, consistent with FIG. 8A. In this example, the verify tests for the S1-S15 states are performed in program loops 1-5, 3-7, 5-9, 7-11, 9-13, 11-15, 13-17, 15-19, 17-21, 19-23, 21-25, 23-27, 25-29, 27-31 and 29-33, respectively. The number of PLs allocated for verify tests of each state is the same, i.e., five loops, in this example. Generally, a different number of PLs can be allocated for verify tests of different states.

FIG. 9 depicts an example voltage signal 900 in a program operation, consistent with FIG. 8D. In this example, the voltage signal includes 33 program-verify loops, PL1-PL33. Each program loop includes a program pulse and verify voltages. For example, a program pulse (plot 901) and verify voltages (plot 902) are provided in PL1. The verify voltages are depicted in a simplified form, and can be provided for progressively higher data states as the programming proceeds, as mentioned. The peak magnitudes of the program pulses may increase in consecutive program loops in a technique referred to as incremental step pulse programming. In one option, verify tests are not performed after the last program pulse, and the results of a verify test in an nth PL are detected in the n+$1^{st}$ PL.

Figure 10A:
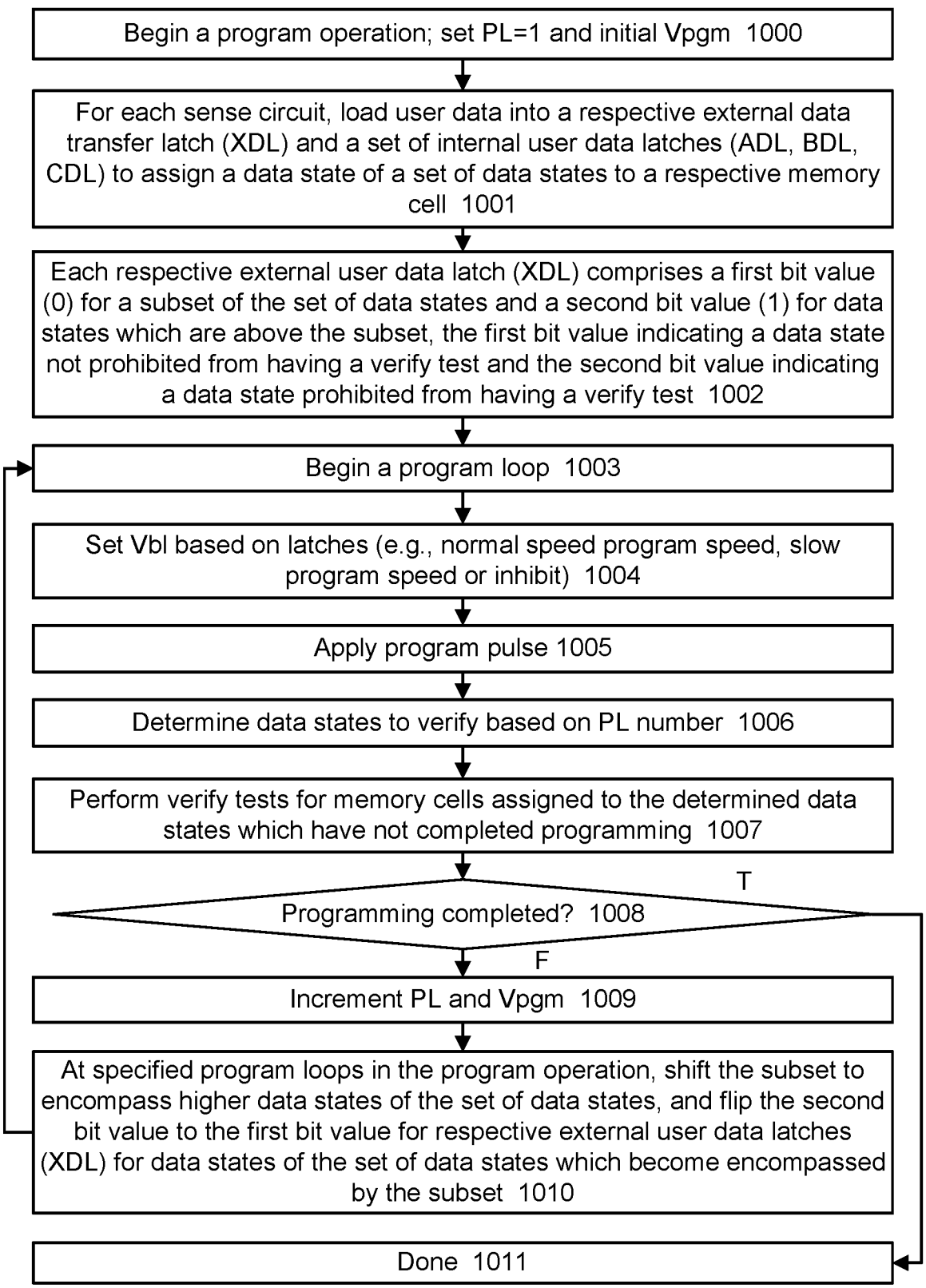
FIG. 10A depicts a flowchart of an example process for performing a program operation which saves time and reduces the number of internal data state latches of a sense circuit.

FIG. 10A depicts a flowchart of an example process for performing a program operation which saves time and reduces the number of internal data state latches of a sense circuit. Step 1000 begins a program operation. A program loop (PL) number is initialized, e.g., PL=1, and the program pulse magnitude Vpgm is set to an initial level. Step 1001 includes, for each sense circuit, loading user data into a respective external data transfer latch (XDL) and a set of internal user data latches (e.g., ADL, BDL, CDL) to assign a data state of a set of data states to a respective memory cell. The data can be loaded into the internal user data latches via the external data transfer latch, one bit at a time, in one approach. A control circuit such as the controller 122 or control circuitry 110 of FIG. 1A may load the data, for example. Step 1002 notes that each respective external user data latch (XDL) comprises a first bit value (e.g., 0) for a subset of the set of data states and a second bit value (e.g., 1) for data states which are above the subset. The first bit value indicates a data state which is not prohibited from having a verify test and the second bit value indicates a data state prohibited from having a verify test. Note that a verify test may or may not be performed for a given memory cell, assigned to a data state which is not prohibited from having a verify test, in a given program loop.

ADL, BDL and CDL are used in a four bit per cell device, while ADL and BDL are used in a three bit per cell device. Other options are possible, such as five bits per cell.

Step 1003 begins a program loop. Step 1004 includes setting the bit line voltage, Vbl based on the latches to achieve a normal speed program speed, slow program speed or inhibit/lockout for a respective memory cell. See also FIG. 10B. Step 1005 applies a program pulse to a set of memory cells. Step 1006 includes determining data states not prohibited from having a verify test based on the PL number and XDL. Step 1007 includes performing verify tests for memory cells assigned to the determined data states at step 1006 which have not completed programming. See also FIG. 10C for further details of steps 1006 and 1007.

A decision step 1008 determines whether the programming is complete for the set of memory cells, such as if the verify tests for the highest data state have been passed by all, or nearly all, of the memory cells assigned to the highest data state. The highest data state in a set of states is that which has the highest verify voltage. If the decision step 1008 is true (T), the program operation is done at step 1011. If the decision step 1008 is false (F), step 1009 increments PL and Vpgm for a next program loop.

Step 1010 includes, at specified program loops in the program operation, shifting the subset to encompass higher data states of the set of data states, and flipping the second bit value to the first bit value for respective external user data latches (XDL) for data states of the set of data states which become encompassed by the subset. For example, in the three-bit per cell example of FIG. 16A, the subset is shifted at the PL=5, 8, 10 and 12. In the four-bit per cell example of FIG. 16B, the subset is shifted at the PL=6, 8, 10, 12, 14, 16 and 18. To flip a bit, a control circuit can load a new bit value into the respective external user data latches at the start of the program loop, or at least before the start of the verify portion of a program loop. See also, e.g., FIG. 14A-14E which depict flipping a bit from 1 to 0 in XDL for the D-G states, respectively. Step 1003 begins a next program loop.

Figure 10B:
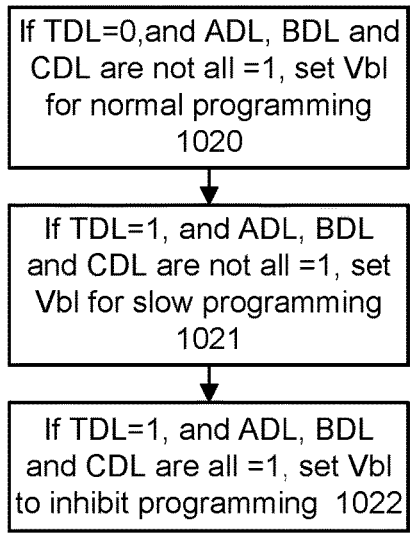
FIG. 10B depicts a flowchart of an example process for setting bit line voltages prior to applying a program pulse, consistent with steps 1004 of FIG. 10A.

FIG. 10B depicts a flowchart of an example process for setting bit line voltages prior to applying a program pulse, consistent with steps 1004 of FIG. 10A. In one approach, the internal TDL latch of the sense circuit indicates whether a memory cell has passed a verify test, e.g., TDL=1 for verify pass. For example, when failing a low verify test, TDL=0 indicates normal speed programming should be used in the next program loop. The user data latches will not all be 1's in this case, indicating that programming of the memory cell is not completed. That is, the memory cell has not passed its lockout verify test. Therefore, step 1020 includes, if TDL=0, and ADL, BDL and CDL are not all=1, setting Vbl for normal programming, e.g., Vbl=0 V.

If a low, but not high, verify test is passed, TDL=1 indicates slow programming should be used in the next program loop. The user data latches will not all be 1's in this case, indicating that programming of the memory cell is not completed. Therefore, step 1021 includes, if TDL=1, and ADL, BDL and CDL are not all=1, setting Vbl for slow programming, e.g., Vbl=0.5 V.

If a lockout verify test is passed, TDL=1 and the user data latches will all be 1's, indicating that programming of the memory cell is completed. Therefore, step 1022 includes, if TDL=1, and ADL, BDL and CDL are all=1, setting Vbl to inhibit programming, e.g., Vbl=1.5-2 V.

Figure 10C:
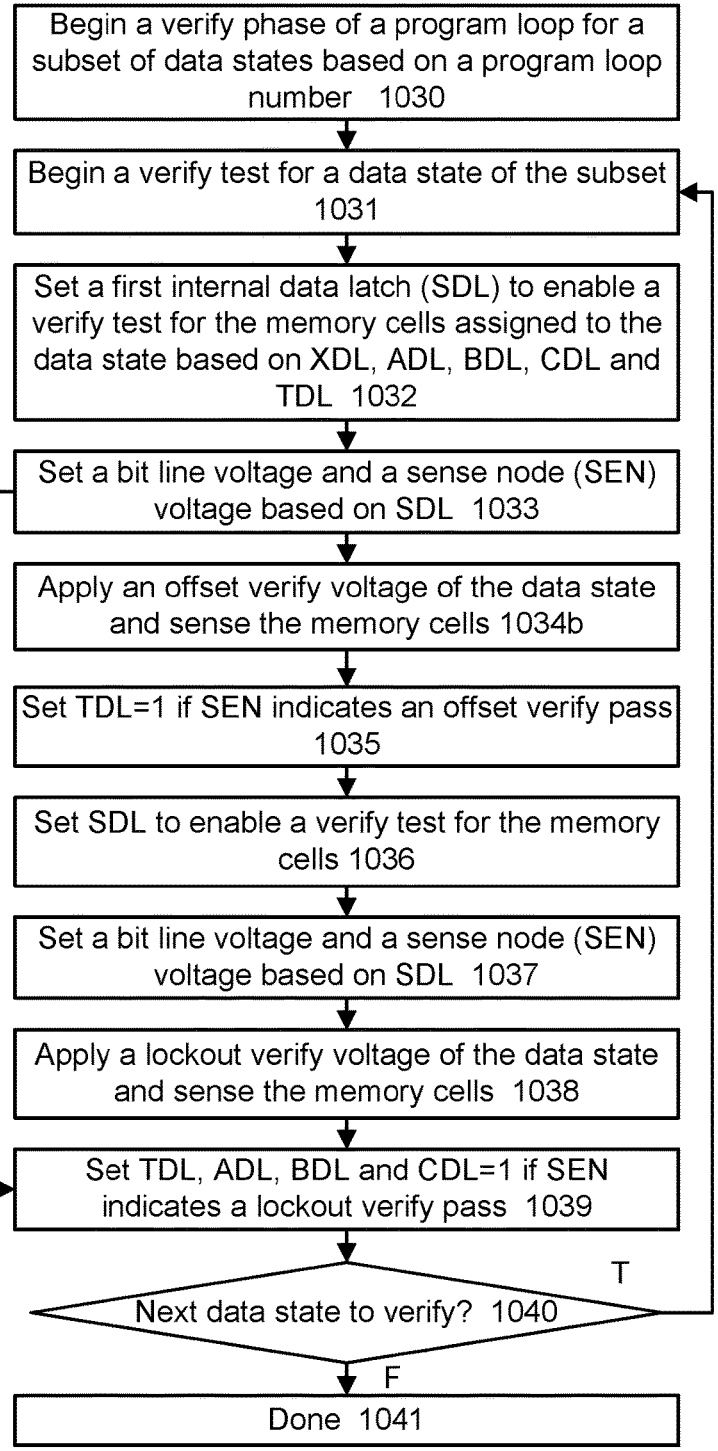
FIG. 10C depicts a flowchart of an example process for performing a verify phase of a program loop, consistent with steps 1006 and 1007 FIG. 10A.

FIG. 10C depicts a flowchart of an example process for performing a verify phase of a program loop, consistent with steps 1006 and 1007 FIG. 10A. Step 1030 begins a verify phase of a program loop for a subset of data states based on a program loop number, such as based on the schedules of FIG. 7C or 8D. Step 1031 begins a verify test for a data state of the subset. Step 1032 includes setting a first internal data latch (SDL) to enable a verify test for the memory cells assigned to the data state based on XDL, ADL, BDL, CDL and TDL.

Step 1032 can be implemented with the following operations, where "—" denotes NOT and "|" denotes OR:
SDL=0 (initialize SDL),
SDL=~ADL|~BDL|~CDL|~TDL (set SDL=0, indicating no verify if ADL, BDL, CDL and TDL are all 1 (program completion); else set SDL=1 indicating a verify test will be performed), and
SDL=SDL*~XDL (no verify test if XDL=1, since XDL=1 prohibits a verify test).

If the bit in XDL is not considered, the bits in ADL, BDL and CDL may not uniquely identify a data state. For example, there could be two data states with the same combination of bits in ADL, BDL and CDL. For example, in the four bit per cell case of FIG. 15A, ADL/BDL/CDL=1/0/0 for both the S2 and S9 states. The additional use of the bit in XDL indicates which data state to use. Specifically, since XDL=0 for S2, and S2 is in the window 1500, S2 is used. XDL=1 for S9, indicating S9 is prohibited from a verify test.

In a three bit per cell case of FIG. 14A, ADL/BDL=1/0 for both the B and E states. Since XDL=0 for B, and B is in the window 1400, B is used. XDL=1 for the E state, indicating the E state is prohibited from a verify test.

Step 1033 includes setting a bit line voltage and a sense node (SEN) voltage based on SDL. For example, the following operations can be performed, where "*" denotes multiplication:
SEN=1 (VSENP) (prepare the sense node with a sense voltage), and SEN=SEN*SDL (SEN=1, indicating verify, if SDL=1).

Step 1034a can be followed if there is a single verify test, e.g., the lockout or program completion verify test for the data state. This step includes applying a verify voltage of the data state and sensing the memory cells. Step 1039 then follows.

Steps 1034b-1039 can be followed if there are both offset and lockout verify tests for the data state. Step 1034b includes applying an offset verify voltage of the data state and sensing the memory cells. Step 1035 includes setting TDL=1 if SEN indicates a low verify pass. Step 1036 includes setting SDL to enable a verify test for the memory cells. Step 1037 includes setting a bit line voltage and a sense node (SEN) voltage based on SDL. Step 1038 includes applying a lockout verify voltage of the data state and sensing the memory cells.

Step 1030 includes setting TDL, ADL, BDL and CDL=1 if SEN indicates a lockout verify pass. This combination of data, which is independent of XDL, indicates programming is completed. A decision step 1040 determines whether there is a next data state to verify in the verify phase of the program loop. If the decision step is true, a verify test for the next data state begins at step 1031. If the decision step is false, the process is done at step 1041.

Figure 11:
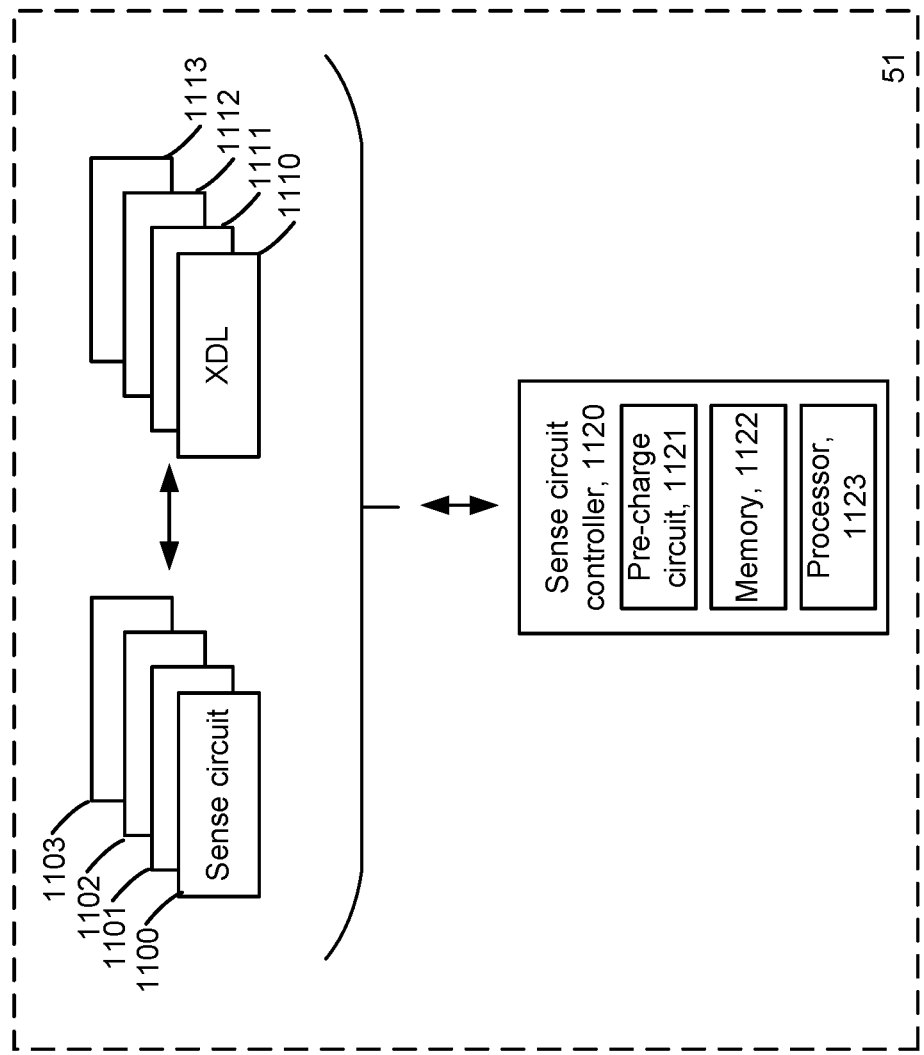
FIG. 11 depicts an example block diagram of the sense block 51 in the column control circuitry of FIG. 1A.

FIG. 11 depicts an example block diagram of the sense block 51 in the column control circuitry of FIG. 1A. The column control circuitry can include multiple sense blocks, where each sense block performs sensing, e.g., read or verify operations, for multiple memory cells via respective bit lines.

In one approach, a sense block comprises multiple sense circuits, also referred to as sense amplifiers. Each sense circuit is associated with data latches and caches. For example, the example sense circuits 1100-1103 are associated with data transfer latches (XDL) 1110-1113, respectively, external to the sense circuits. Each XDL latch is an example of a cache.

Figure 12:
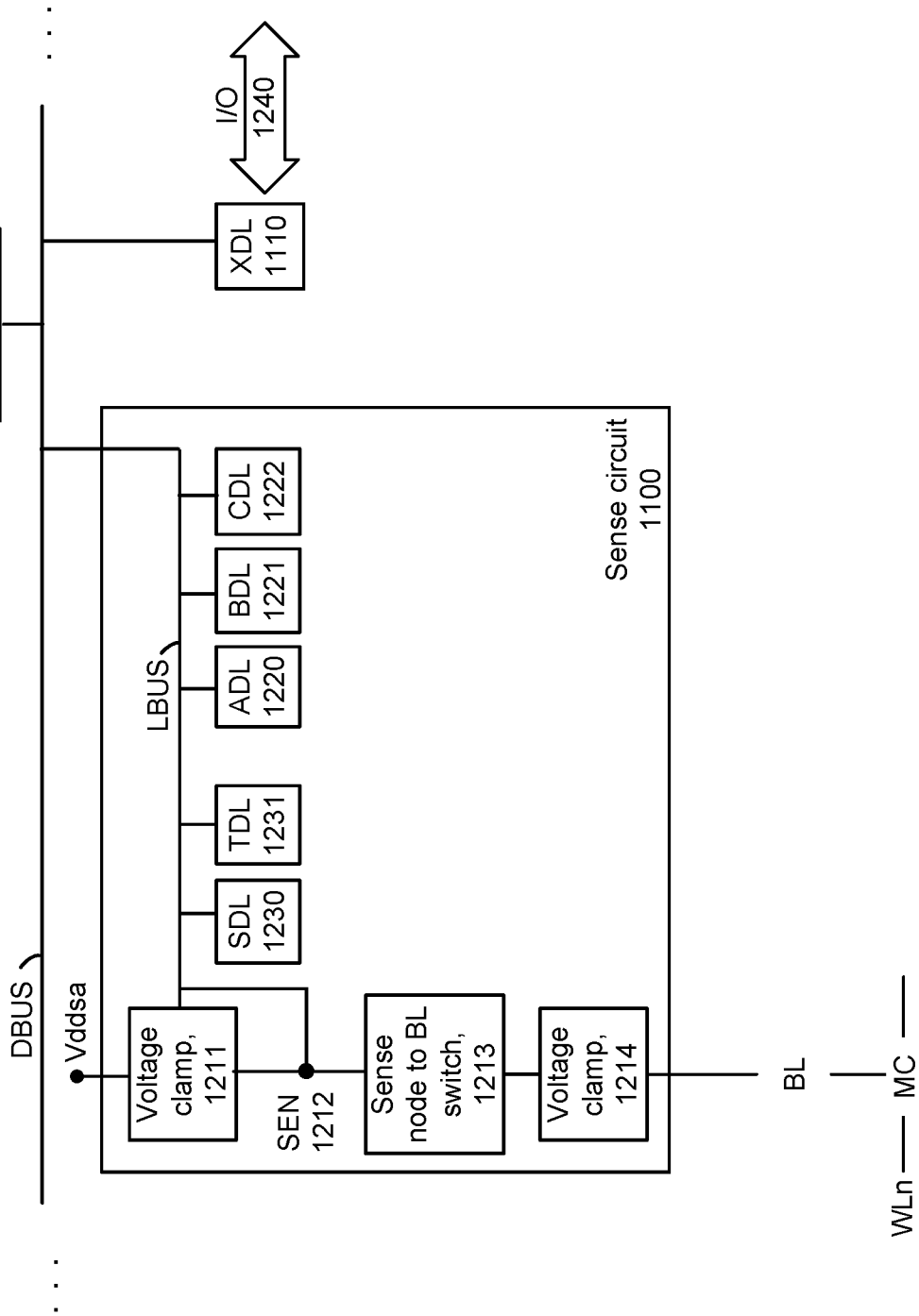
FIG. 12 depicts an example block diagram of the sense circuit 1100 of FIG. 11.

In one approach, different subsets of bit lines can be sensed using different respective sense blocks. This allows the processing load which is associated with the sense circuits to be divided up and handled by a respective processor in each sense block. For example, a sense circuit controller 1120 can communicate with the set, e.g., sixteen, of sense circuits and associated latches. The sense circuit controller may include a pre-charge circuit 1121 which provides a voltage to each sense circuit for setting a pre-charge voltage. In one possible approach, the voltage is provided to each sense circuit independently, e.g., via a data bus DBUS and a local bus LBUS, such as depicted in FIG. 12. In another possible approach, a common voltage is provided to each sense circuit concurrently. The sense circuit controller may also include a memory 1122 and a processor 1123. Further example details of the sense circuit controller and the sense circuit 1100 are provided in FIG. 12.

FIG. 12 depicts an example block diagram of the sense circuit 1100 of FIG. 11. The sense circuit controller 1120 is also depicted, along with the XDL latch 1110. The sense circuit controller 1120 communicates with multiple sense circuits including the example sense circuit 1100. The sense circuit includes the internal latches SDL 1230 and TDL 1231 and internal user data latches ADL 1220, BDL 1221 and CDL 1222, in a four bit per cell example. ADL and BDL are used in a three bit per cell example.

The sense circuit further includes a voltage clamp 1211 such as a transistor which sets a pre-charge voltage at a sense node 1212 (SEN). A sense node-to-bit line (BL) switch 1213 selectively allows the sense node to communicate with a bit line BL. The bit line is connected to a respective memory cell MC such as in a respective NAND string. The example memory cell MC is connected to a selected word line WLn. A voltage clamp 1214 can set a voltage on the bit line, such as during a sensing operation or during a program pulse.

A local bus, LBUS, allows the sense circuit controller to communicate with components in the sense circuit, such as the latches and the voltage clamp. The sense circuit controller communicates with LBUS in each sense circuit via another bus, DBUS, which is external to, and connected to, a set of sense circuits. The communicating can include sending data to the sense circuits and/or receive data from the sense circuits. The sense circuit controller can communicate with different sense circuits in a time-multiplexed manner, for instance.

The XDL latch is external to the sense circuit 1100 and therefore cannot be accessed quickly on LBUS. Instead, XDL is accessed on DBUS. XDL can further communicate with a control circuit via an input/output (I/O) path 1240.

Figure 13:
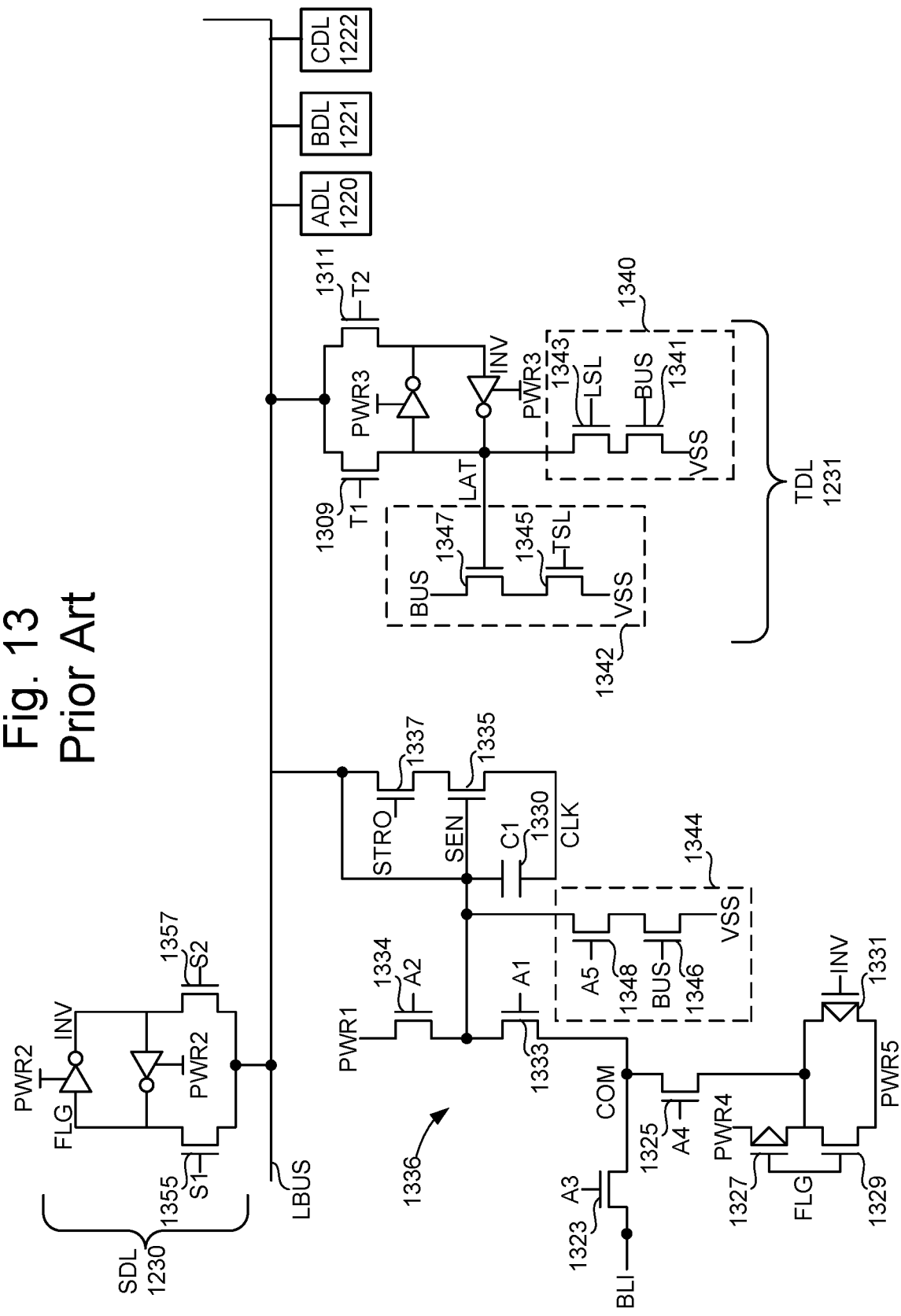
FIG. 13 depicts an example implementation of the sense circuit 1100 of FIG. 12.

FIG. 13 depicts an example implementation of the sense circuit 1100 of FIG. 12. Generally, the sense circuit includes a small number of data latches for performing a number of memory operations including scan operations whereby the results of sensing are used in logic operations, for example, to combine data from different user data latches or with other data. In particular, logic operations such as AND, OR, and XOR can be performed such as to support low and lockout verify tests. In one approach, the sense circuit may set three different bit line voltages, e.g., for normal programming, slow programming and program inhibit/lockout, using dynamic latches and data shifting within the sense circuit. The sense circuit is capable of pre-charging bit lines while scanning data to combine sense results with program data from the user data latches.

The sense circuit includes a first data latch SDL 1230 which is coupled to a local bus LBUS for controlling a corresponding bit line. SDL may be referred to as a sense data latch and includes internal nodes FLG and INV for controlling the bit line during reading and programming based on a value of LBUS. SDL 1230 can be a static data latch. A second data latch TDL 1231 is provided having a static data latch portion, similar to SDL, as well as a first latch scan circuit 1340 and a second scan circuit 1342. Three user data latches ADL (1220), BDL (1221) and CDL (1222) are connection to the sense circuit controller and to other components in the sense circuit via LBUS. User data latches ADL, BDL and CDL can be static data latches used to hold user data for programming to a memory cell, or data that is read from a memory cell at the corresponding bit line. Three user data latches are presented as an example, but any number of user data latches may be used according to the data coding of a particular implementation.

The sense circuit can be connected to a bit line at a node BLI and to LBUS. The input signal CLK is received and can be supplied at the lower plate of the capacitor C1 1331. The sense circuit is then also connected to a high voltage power supply PWR4 and ground or VSS.

SDL 1230 has a first node FLG and a second node INV, where these nodes are coupled to a pair of series connected amplifiers. The level on FLG can then be connected to LBUS through the transistor 1355 with a control signal S1. The level on INV can be connected to LBUS through the transistor 1357 with a control signal S2.

TDL 1231 includes a static latch portion as well as latch scan circuitry to support low and high verify tests of a data state. The static latch portion includes a first leg with node LAT and a second leg with node INV, where the nodes are coupled to a pair of series connected amplifiers. The level on LAT can be connected to LBUS through the switch 1309 with a control signal T1 and the opposite level on INV can be connected to LBUS through the transistor 1311 with a control signal T2.

The first latch scan circuit 1340 in TDL 1231 has an upper node connected to node LAT within the static data latch portion and a lower node connected to ground or VSS. The upper node connects to a first transistor 1343 forming a switch having a gate controlled by control signal LSL. The first transistor is in series with a second transistor 1341 forming a switch having a gate controlled by LBUS. As a result, the level at LAT may be combined with the level of LBUS to perform logic operations as part of a scan during verify operations. When LBUS is high, any voltage at LAT will drain to ground. When LBUS is low, the value of LAT is held at its original level. This permits a scan operation to be performed while writing the value to TDL. Accordingly, SDL permits the value of TDL 1231 to be used in a logic operation with the LBUS value according to LAT=LAT AND COMP(LBUS), where COMP is the complement of LBUS. That is, COMP(LBUS)=0 if LBUS=1 and COMP (LBUS)=1 if LBUS=0.

The second scan circuit 1342 in TDL 1231 has an upper node connected to LBUS and a lower node connected to VSS. The upper node connects to a first transistor 1347 forming a switch having a gate controlled by the value at node LAT of the static data latch portion of TDL. The first transistor 1347 is in series with a second transistor 1345 forming a switch having a gate controlled by control signal TSL. In this manner, the level at node LBUS may be combined with the level of LAT to perform additional logic. When LAT is high, any voltage at LBUS will drain to ground. When LAT is low, the value of LBUS is held at its original level. Accordingly, the second latch circuit permits the value of LBUS to be used in a logic operation with the data latch value of TDL according to LBUS=LBUS AND COMP(LAT).

The sense circuit includes bit line selection and intermediate circuitry between the bit line BLI and SLD and TDL. BLI can be selectively connected to the node COM by use of the selection transistor 1323 controlled by A3. COM can also be connected to the high supply level PWR4 by the transistor 1325 controlled by A4 and by use of the pMOS transistor 1327. The transistor 1327 is controlled by FLG. Transistor 1329 is also controlled by FLG and is connected in series with PMOS transistor 1331, controlled by INV.

The internal dynamic sense node SEN can be connected to, or isolated from, the COM node by the transistor 1333 controlled by A1. The top plate of the capacitor C1 1330 is also connected to SEN. In addition to being connected to the bottom plate of C1 1330, the CLK signal is also connected to the LBUS by way of the transistor 1335, whose gate is connected to the SEN node, connected in series with the independently controllable transistor STRO 1337. SEN may be connected to a voltage supply PWR1 through the transistor 1334 controlled by A2.

A third scan circuit 1344 has an upper node connected to SEN and a lower node connected to VSS or ground. The upper node connects to a first transistor 1348 forming a switch having a gate controlled by control signal A5. The first transistor is in series with a second transistor 1346 forming a switch having a gate controlled by LBUS. In this manner, the level at the SEN node may be combined with the level of LBUS to perform logic operations as part of a scan during low and high verify tests. When LBUS is high, any voltage at SEN will drain to ground. When LBUS is low, the value of SEN is held at its original level. Accordingly, the first latch circuit permits the value of the SEN node to be used in a logic operation with the LBUS value according to SEN=SEN AND COMP(LBUS).

The sense circuit can pre-charge a bit line concurrently with a data transfer or scan operation that applies logic to the sense results. During the bit line pre-charge through the bit line select switches, COM may stay at the power supply voltage level. During data transfer, the data information from FLG or LAT may be sent to LBUS. A bit line can be pre-charged at the same time as a data transfer.

Also, as mentioned, three bit line values can be set using a dynamic latch arrangement and data transfer process. In a two bit line forced program arrangement, INV is '0' and FLG is '1' for a programmed bit line. PWR5 is equal to VSS. In a first step, the programmed bit line is connected to PWR5 through transistors 1325 and 1331 and the inhibited BL is connected to PWR4. In a second step, the data for slow programming is scanned into SDL so FLG=1, while transistor 1325 lowers the value for slow programming.

FIG. 14A depicts example user data at the start of a program operation in an eight-state memory device, including a window 1400 encompassing a subset of data states A-C. In this example, the Er-G states are identified by XDL/ADL/BDL=1/1/1, 1/1/0, 1/0/0, 0/0/0, 0/1/0, 0/1/1, 0/0/1 and 1/0/1 for the Er-G states, respectively. The user data, or a set of user data bits, is loaded into XDL/ADL/BDL by a control circuit. Various encodings are possible. The bottom half of the data states, Er-C, have XDL=0 and the top half of the data states, D-G have XDL=1. The window 1400 defines a subset of data states A-C. These are N/2−1 programmed states in a set of N data states Er-G. In this example, the number of data states in a subset remains fixed. However, other options are possible. For example, see FIG. 14A1-14D1.

XDL=0 for each data state in the window, indicating the data state is not prohibited from a verify test. The respective memory cell may or may not be programmed, depending on the schedule of PL versus data state, and whether or not the memory cell has previously completed programming. XDL=1 for each data state above the window, indicating the data state is prohibited from a verify test. A data state is above another data state or window of data states when its verify voltage is higher than that of the another data state or window of data states.

This technique reduces the number of internal data latches which are needed to identify the assigned data state of a memory cell. Essentially, the data states outside the window can be ignored and the focus can be on the data states within the window, in terms of whether a verify test should be performed. TDL=1 is set for the Er state at the start of the program operation to signal a verify pass status since no verify test is performed.

As the programming progresses, the XDL bit is flipped from 1 to 0 each time the window is shifted, to add one higher state to the subset and remove one lower state. For example, when the A state completes programming, at a specified program loop, the window is shifted up by one state to encompass the E state and remove the A state. At this point, the focus is on enabling verify tests for the B-D states.

States which are removed from the window continue to have XDL=0, in one approach.

The meaning of the 0 bit, a first bit value, and the 1 bit, a second bit value, for XDL can be reversed.

The shifting of the window or subset of states can be based on the PL number, such as depicted in FIG. 16A.

In FIGS. 14B-14G, 14B1-14D1, 15B-15P and 15B1-15H1, a changed (flipped) bit is indicated by underlining.

FIG. 14B depicts the example user data of FIG. 14A after the A state completes programming, where the window is shifted to encompass a subset of data states B-D. The D state is added and the A state is removed. TDL/ADL/BDL are flipped from 0/0/0 to 1/1/1 for the A state to identify lockout, e.g., program completion. XDL is flipped from 1 to 0 for the D state to indicate it is no longer prohibited from having a verify test.

FIG. 14C depicts the example user data of FIG. 14A after the B state completes programming, where the window is shifted to encompass a subset of data states C-E. The E state is added, and the B state is removed. TDL/BDL are flipped from 0/0 to 1/1 for the B state, and XDL is flipped from 1 to 0 for the E state.

FIG. 14D depicts the example user data of FIG. 14A after the C state completes programming, where the window is shifted to encompass a subset of data states D-F. The F state is added, and the C state is removed. TDL/ADL are flipped from 0/0 to 1/1 for the C state, and XDL is flipped from 1 to 0 for the F state.

FIG. 14E depicts the example user data of FIG. 14A after the D state completes programming, where the window is shifted to encompass a subset of data states E-G. The G state is added, and the D state is removed. TDL/ADL/BDL are flipped from 0/0/0 to 1/1/1 for the D state, and XDL is flipped from 1 to 0 for the G state. This is the last XDL bit flip in the program operation, in one approach.

FIG. 14F depicts the example user data of FIG. 14A after the E state completes programming, where the window continues to encompass a subset of data states E-G. TDL/BDL are flipped from 0/0 to 1/1 for the E state.

FIG. 14G depicts the example user data of FIG. 14A after the F state completes programming, where the window continues to encompass a subset of data states E-G. TDL/ADL/BDL are flipped from 0/0/0 to 1/1/1 for the F state.

FIG. 14H depicts the example user data of FIG. 14A after the G state completes programming, where the window continues to encompass a subset of data states E-G. TDL is flipped from 0 to 1 for the G state.

FIG. 14A1-14D1 provide an alternative approach which replaces FIG. 14A-14D, respectively.

FIG. 14A1 depicts example user data at the start of a program operation in an eight-state memory device, including a window 1400 encompassing a subset of data states A-C. This is the same as FIG. 14A but is repeated here to provide a context for FIG. 14B1-14D1.

FIG. 14B1 depicts the example user data of FIG. 14A after the A state completes programming, where the window is shifted to encompass a subset of data states B-E. The window 1401 is increased in size to encompass four data states instead of three, as in the window 1400. Generally, the window can have no more than N/2 states when there are N states in total. A window size of N/2−1 or N/2 states divides the total number of states at least in half, so that the two bits in the internal data latches ADL and BDL are sufficient to identify the assigned data state in a three-bit per cell device, once XDL is known. Due to the increase in the window size, the XDL bits for two data states, D and E, are flipped from 1 to 0, indicating these states are no longer prohibited from a verify test. TDL/ADL/BDL are flipped from 0/0/0 to 1/1/1 for the A state.

FIG. 14C1 depicts the example user data of FIG. 14A after the B state completes programming, where the window is shifted to encompass a subset of data states C-F. The window continues to encompass four data states. TDL/BDL are flipped from 0/0 to 1/1 for the B state, and XDL is flipped from 1 to 0 for the F state.

FIG. 14D1 depicts the example user data of FIG. 14A after the C state completes programming, where the window is shifted to encompass a subset of data states D-G. The window continues to encompass four data states. TDL/ADL are flipped from 0/0 to 1/1 for the C state, and XDL is flipped from 1 to 0 for the G state. This is the last XDL bit flip in the program operation, in one approach. The window can continue to encompass the D-G states for a remainder of the program operation.

FIG. 15A depicts example user data at the start of a program operation in a sixteen-state memory device, including a window 1500 encompassing a subset of data states S1-S7. As before, the data states outside the window can be ignored and the focus can be on the data states within the window, in terms of whether a verify test should be performed.

FIG. 15B depicts the example user data of FIG. 15A after the S1 state completes programming, where the window is shifted to encompass a subset of data states S2-S8. The S8 state is added and the S1 state is removed. TDL/BDL are flipped from 0/0 to 1/1 for the S1 state, and XDL is flipped from 1 to 0 for the S8 state.

FIG. 15C depicts the example user data of FIG. 15A after the S2 state completes programming, where the window is shifted to encompass a subset of data states S3-S9. The S9 state is added and the S2 state is removed. TDL/BDL/CDL are flipped from 0/0/0 to 1/1/1 for the S2 state, and XDL is flipped from 1 to 0 for the S9 state.

FIG. 15D depicts the example user data of FIG. 15A after the S3 state completes programming, where the window is shifted to encompass a subset of data states S4-S10. The S10 state is added and the S3 state is removed. TDL/CDL are flipped from 0/0 to 1/1 for the S3 state, and XDL is flipped from 1 to 0 for the S10 state.

FIG. 15E depicts the example user data of FIG. 15A after the S4 state completes programming, where the window is shifted to encompass a subset of data states S5-S11. The S11 state is added and the S4 state is removed. TDL/ADL are flipped from 0/0 to 1/1 for the S4 state, and XDL is flipped from 1 to 0 for the S11 state.

FIG. 15F depicts the example user data of FIG. 15A after the S5 state completes programming, where the window is shifted to encompass a subset of data states S6-S12. The S12 state is added and the S5 state is removed. TDL/ADL/CDL are flipped from 0/0/0 to 1/1/1 for the S5 state, and XDL is flipped from 1 to 0 for the S12 state.

FIG. 15G depicts the example user data of FIG. 15A after the S6 state completes programming, where the window is shifted to encompass a subset of data states S7-S13. The S13 state is added and the S6 state is removed. TDL/ADL/BDL are flipped from 0/0/0 to 1/1/1 for the S6 state, and XDL is flipped from 1 to 0 for the S13 state.

FIG. 15H depicts the example user data of FIG. 15A after the S7 state completes programming, where the window is shifted to encompass a subset of data states S8-S14. The S14 state is added and the S7 state is removed. TDL/ADL/BDL/CDL are flipped from 0/0/0/0 to 1/1/1/1 for the S7 state, and XDL is flipped from 1 to 0 for the S14 state.

FIG. 15I depicts the example user data of FIG. 15A after the S8 state completes programming, where the window is shifted to encompass a subset of data states S9-S15. The S15 state is added and the S8 state is removed. TDL/BDL are flipped from 0/0 to 1/1 for the S8 state, and XDL is flipped from 1 to 0 for the S15 state. This is the last XDL bit flip in the program operation, in one approach. The window can continue to encompass the S9-S15 states for a remainder of the program operation.

FIG. 15J depicts the example user data of FIG. 15A after the S9 state completes programming, where the window continues to encompass a subset of data states S9-S15. TDL/BDL/CDL are flipped from 0/0/0 to 1/1/1 for the S9 state.

FIG. 15K depicts the example user data of FIG. 15A after the S10 state completes programming, where the window continues to encompass a subset of data states S9-S15. TDL/CDL are flipped from 0/0 to 1/1 for the S10 state.

FIG. 15L depicts the example user data of FIG. 15A after the S11 state completes programming, where the window continues to encompass a subset of data states S9-S15. TDL/ADL are flipped from 0/0 to 1/1 for the S11 state.

FIG. 15M depicts the example user data of FIG. 15A after the S12 state completes programming, where the window continues to encompass a subset of data states S9-S15. TDL/ADL/CDL are flipped from 0/0/0 to 1/1/1 for the S12 state.

FIG. 15N depicts the example user data of FIG. 15A after the S13 state completes programming, where the window continues to encompass a subset of data states S9-S15. TDL/ADL/BDL are flipped from 0/0/0 to 1/1/1 for the S13 state.

FIG. 15O depicts the example user data of FIG. 15A after the S14 state completes programming, where the window continues to encompass a subset of data states S9-S15. TDL/ADL/BDL/CDL are flipped from 0/0/0/0 to 1/1/1/1 for the S14 state.

FIG. 15P depicts the example user data of FIG. 15A after the S15 state completes programming, where the window continues to encompass a subset of data states S9-S15. TDL is flipped from 0 to 1 for the S15 state.

FIG. 15A1-15H1 provide an alternative approach which replaces FIG. 15A-15H, respectively.

FIG. 15A1 depicts example user data at the start of a program operation in a sixteen-state memory device, including a window 1500 encompassing a subset of data states S1-S7. This is the same as FIG. 15A but is repeated here to provide a context for FIG. 15B1-15H1. The window has seven data states.

FIG. 15B1 depicts the example user data of FIG. 15A after the S1 state completes programming, where the window is shifted to encompass a subset of data states S2-S9. Here, the window 1501 is increased in size to encompass eight data states instead of seven as in the window 1500. As before, the window can have no more than N/2 states when there are N states in total. A window size of N/2−1 or N/2 states divides the total number of states at least in half, so that the three bits in the internal data latches ADL, BDL and CDL are sufficient to identify the assigned data state in a four-bit per cell device, once XDL is known. Due to the increase in the window size, the XDL bits for two data states, S8 and S9, are flipped from 1 to 0, to indicate they are no longer prohibited from a verify test. TDL/BDL are flipped from 0/0 to 1/1 for the S1 state.

FIG. 15C1 depicts the example user data of FIG. 15A after the S2 state completes programming, where the window is shifted to encompass a subset of data states S3-S10. The window continues to encompass eight data states. TDL/BDL/CDL are flipped from 0/0/0 to 1/1/1 for the S2 state, and XDL is flipped from 1 to 0 for the S10 state.

FIG. 15D1 depicts the example user data of FIG. 15A after the S3 state completes programming, where the window is shifted to encompass a subset of data states S4-S11. TDL/CDL are flipped from 0/0 to 1/1 for the S3 state, and XDL is flipped from 1 to 0 for the S11 state.

FIG. 15E1 depicts the example user data of FIG. 15A after the S4 state completes programming, where the window is shifted to encompass a subset of data states S5-S12. TDL/ADL are flipped from 0/0 to 1/1 for the S4 state, and XDL is flipped from 1 to 0 for the S12 state.

FIG. 15F1 depicts the example user data of FIG. 15A after the S5 state completes programming, where the window is shifted to encompass a subset of data states S6-S13. TDL/ADL/CDL are flipped from 0/0/0 to 1/1/1 for the S5 state, and XDL is flipped from 1 to 0 for the S13 state.

FIG. 15G1 depicts the example user data of FIG. 15A after the S6 state completes programming, where the window is shifted to encompass a subset of data states S7-S14. TDL/ADL/BDL are flipped from 0/0/0 to 1/1/1 for the S6 state, and XDL is flipped from 1 to 0 for the S14 state.

FIG. 15H1 depicts the example user data of FIG. 15A after the S7 state completes programming, where the window is shifted to encompass a subset of data states S8-S15. TDL/ADL/BDL/CDL are flipped from 0/0/0/0 to 1/1/1/1 for the S7 state, and XDL is flipped from 1 to 0 for the S15 state. This is the last XDL bit flip in the program operation, in one approach. The window can continue to encompass the S8-S15 states for a remainder of the program operation.

FIG. 16A depicts an example schedule of specified program loops in which a shift in a window occurs, consistent with the three-bit per cell examples of FIGS. 7C, 14A-14H and 14A1-14D1. As mentioned, the window or subset of data states which are not prohibited from a verify test can be shifted according to a schedule of program loop numbers. In this example, for PL=1-4, the window is in the initial position of FIG. 14A. At PL=5, when the A state completes programming, the window is shifted to the position of FIG. 14B or 14B1. At PL=8, when the B state completes programming, the window is shifted to the position of FIG. 14C or 14C1. At PL=10, when the C state completes programming, the window is shifted to the position of FIG. 14D or 14D1. At PL=12, when the D state completes programming, the window is shifted to the position of FIG. 14E or 14E1.

FIG. 16B depicts an example schedule of specified program loops in which a shift in a window occurs, consistent with the four-bit per cell examples of FIGS. 8D, 15A-15P and 15A1-15H1. In this example, for PL=1-5, the window is in the initial position of FIG. 15A. At PL=6, when the S1 state completes programming, the window is shifted to the position of FIG. 15B or 15B1. At PL=8, when the S2 state completes programming, the window is shifted to the position of FIG. 15C or 15C1. At PL=10, when the S3 state completes programming, the window is shifted to the position of FIG. 15D or 15D1. At PL=12, when the S4 state completes programming, the window is shifted to the position of FIG. 15E or 15E1. At PL=14, when the S5 state completes programming, the window is shifted to the position of FIG. 15F or 15F1. At PL=16, when the S6 state completes programming, the window is shifted to the position of FIG. 15G or 15G1. At PL=18, when the S7 state completes programming, the window is shifted to the position of FIG. 15H or 15H1.

In FIG. 17A-17G, the vertical dimension denotes voltage, and the horizontal dimension denotes time, with time points t0-t15. The period of time depicted corresponds to one program loop or program-verify iteration and includes a pre-charge phase 1791 (t0-t2), a program phase 1792 (t2-t4), a recovery phase 1793 (t4-t9) and a verify phase 1794

(*t9*-*t15*). The voltages depicted are examples. The verify phase includes low and high verify tests for the A and B states as an example.

FIG. 17A depicts voltages applied to a selected word line, WLn in a program loop of a program operation. In the pre-charge phase, a plot 1701 represents a turn on voltage for the memory cells such as 6 V.

In the program phase, a plot 1702 represents Vpass and a plot 1703 represents the program pulse magnitude, Vpgm.

In the recovery phase, a plot 1704 represents a positive recovery voltage of Vcc=3 V. In the verify phase, a plot 1705 represents a voltage pulse at Vread. The voltage is then reduced to, e.g., 0 V at plot 1706 and increased to VvAL, VvA, VvBL and VvB at plots 1708, 1709, 1710 and 1711, respectively. The memory cells assigned to these data states are sensed during the corresponding verify voltage.

FIG. 17B depicts a voltage, VWL_unsel, applied to unselected word lines, consistent with FIG. 17A. A plot 1714 represents a turn on voltage such as 6 V, a plot 1711 represents a pass voltage, Vpass, a plot 1712 represents a transition voltage, Vpass2Vread, and a plot 1713 represents Vread.

FIG. 17C depicts a voltage, Vbl_sel, applied to bit lines of programmed NAND strings, consistent with FIG. 17A. A plot 1720 represents a pre-charge voltage of, e.g., 1 V, a plot 1721 represents 0.5 V, and a plot 1722 represents Vsense=0.8 V.

FIG. 17D depicts a voltage, Vbl_unsel, applied to bit lines of unselected NAND strings, consistent with FIG. 17A. A plot 1730 represents 2 V in the pre-charge and program phases, a plot 1731 represents 0 V in the recovery phase and a plot 1732 represents 2 V in the verify phase.

FIG. 17E depicts a voltage, Vsgd_sel, applied to SGD transistors of a selected sub-block, consistent with FIG. 17A. A plot 1740 represents 8 V, a plot 1741 represents 2.5 V, a plot 1742 represents 0 V and a plot 1743 represents 8 V.

FIG. 17F depicts voltages applied to SGD transistors of unselected sub-blocks and to SGS transistors, consistent with FIG. 17A. A plot 1750 represents 8 V and a plot 1754 represents 0 V for Vsgs and Vsgd_unsel, respectively. A plot 1751 represents 0 V for both Vsgs and Vsgd_unsel. A plot 1752 represents 8 V for Vsgs and a plot 1753 represents 0 V for Vsgd_unsel.

FIG. 17G depicts a voltage applied to a source line, consistent with FIG. 17A. A plot 1760 represents a pre-charge voltage such as 1 V, a plot 1761 represents 0 V and a plot 1762 represents 1 V.

Accordingly, it can be seen that in one implementation, an apparatus comprises: a control circuit configured to connect to a plurality of sense circuits, each sense circuit comprising a set of internal user data latches, and to a respective external data transfer latch of each sense circuit, each sense circuit of the plurality of sense circuits is configured to connect to a respective memory cell of a set of memory cells. The control circuit is configured to: for each sense circuit, load user data into the respective external data transfer latch and the set of internal user data latches to assign a data state of a set of data states to the respective memory cell in a program operation, each respective external data transfer latch comprising a first bit value for a subset of the set of data states and a second bit value for data states of the set of data states which are above the subset, the first bit value indicating a data state not prohibited from having a verify test and the second bit value indicating a data state prohibited from having a verify test; and at specified program loops of the program operation, shift the subset to encompass higher data states of the set of data states, and flip the second bit value to the first bit value for respective external data transfer latches for data states of the set of data states which become encompassed by the subset.

In another implementation, a method comprises: loading a bit of a set of bits of user data into a respective external data transfer latch of a sense circuit, the sense circuit is configured to connect to a respective memory cell; loading remaining bits of the set of bits of user data into internal user data latches of the sense circuit; setting a first internal latch of the sense circuit based on the bit in the respective external data transfer latch and bits in the internal user data latches, the respective memory cell is prohibited or not prohibited from having a verify test based on the first internal latch; setting a second internal latch of the sense circuit to indicate whether a verify test for program completion is passed by the respective memory cell; updating the internal user data latches in response to the respective memory cell passing the verify test for program completion; and determining that programming is completed for the respective memory cell based on a combination of the second internal latch and the updated internal user data latches.

In another implementation, an apparatus comprises: a control circuit configured to connect to a plurality of sense circuits, each sense circuit comprising a set of internal user data latches, and to a respective transfer data latch of each sense circuit, each sense circuit of the plurality of sense circuits is configured to connect to a respective memory cell of a set of memory cells; and an interface connected to the control circuit. The control circuit is configured to issue commands via the interface to: for each sense circuit, load a bit of a set of bits of user data into the respective transfer data latch and remaining bits of the set of bits of user data into the set of internal user data latches, each respective data transfer latch comprising a first bit value for a subset of a set of data states and a second bit value for data states of the set of data states which are above the subset, the first bit value indicating the data state defined by the respective data transfer latch is not prohibited from having a verify test and the second bit value indicating a data state defined by the respective data transfer latch is prohibited from having a verify test; shift the subset higher by one data state at specified program loops in a program operation; and with each shift, flip the second bit value to the first bit value for each respective data transfer latch for a data state of the set of data states which becomes encompassed by the subset.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a control circuit configured to connect to a plurality of sense circuits, each sense circuit comprising a set of internal user data latches, and to a respective external data transfer latch of each sense circuit, each sense circuit of the plurality of sense circuits is configured to connect to a respective memory cell of a set of memory cells, each memory cell is programmable to a data state of a set of data states in a program operation in which each respective external data transfer latch holds a first bit value for a subset of the set of data states and a second bit value for data states of the set of data states which are above the subset, the first bit value indicating a data state not prohibited from having a verify test and the second bit value indicating a data state prohibited from having a verify test, the control circuit is configured to:
  for each sense circuit, load user data into the respective external data transfer latch and the set of internal user data latches to assign the data state of the set of data states to the respective memory cell in the program operation; and
  at specified program loops of the program operation, shift the subset to encompass higher data states of the set of data states, and flip the second bit value to the first bit value for respective external data transfer latches for data states of the set of data states which become encompassed by the subset.

2. The apparatus of claim 1, wherein:
the subset encompasses a lowest programmed state of the set of data states at a start of the program operation and a highest programmed state of the set of data states at a completion of the program operation.

3. The apparatus of claim 1, wherein:
the control circuit is configured to maintain a schedule indicating a correspondence between data states to verify and a program loop number in the program operation.

4. The apparatus of claim 1, wherein:
each sense circuit comprises an internal latch; and
the bit value of the respective external data transfer latch is accessed a single time to set a bit of the internal latch at a start of multiple verify tests for a respective memory cell in a program loop of the program operation; and
the internal latch is configured to set a voltage of a bit line voltage associated with the respective memory cell.

5. The apparatus of claim 4, wherein:
the multiple verify tests comprise an offset verify test and a lockout verify test for the assigned data state of the respective memory cell.

6. The apparatus of claim 1, wherein:
each sense circuit comprises an internal latch; and
for each sense circuit, the internal latch is configured to set a bit which indicates when the respective memory cell has passed a lockout verify test, and the set of internal user data latches is updated based on the internal latch when the respective memory cell has passed the lockout verify test.

7. The apparatus of claim 6, wherein:
for each sense circuit, the internal latch in combination with the respective set of internal user data latches are configured to indicate, independently of the bit value of the respective external data transfer latch, that the respective memory cell has passed the lockout verify test for program completion.

8. The apparatus of claim 1, wherein:
the set of memory cells are configured to store data in N data states; and
the subset comprises no more than N/2 data states.

9. The apparatus of claim 1, wherein:
the set of memory cells are configured to store M bits per memory cell; and
for each sense circuit, the set of internal user data latches comprises M−1 internal user data latches configured to store M−1 bits of the user data, one bit per internal user data latch, and the respective external data transfer latch is configured to store one bit of the user data.

10. The apparatus of claim 1, wherein:
for each sense circuit, the respective external data transfer latch is configured to transfer data to and from the set of internal user data latches.

11. An apparatus, comprising:
a control circuit configured to connect to a plurality of sense circuits, each sense circuit comprising a set of internal user data latches, and to a respective transfer data latch of each sense circuit, each respective data transfer latch comprising a first bit value for a subset of a set of data states and a second bit value for data states of the set of data states which are above the subset, the first bit value indicating the data state defined by the respective data transfer latch is not prohibited from having a verify test and the second bit value indicating a data state defined by the respective data transfer latch is prohibited from having a verify test, each sense circuit of the plurality of sense circuits is configured to connect to a respective memory cell of a set of memory cells; and
an interface connected to the control circuit, the control circuit is configured to issue commands via the interface to:
  for each sense circuit, load a bit of a set of bits of user data into the respective transfer data latch and remaining bits of the set of bits of user data into the set of internal user data latches;
  shift the subset higher by one data state at specified program loops in a program operation; and
  with each shift, flip the second bit value to the first bit value for each respective data transfer latch for a data state of the set of data states which becomes encompassed by the subset.

12. The apparatus of claim 11, wherein:
the control circuit is configured to maintain a schedule of different data states to verify in different program loops of the program operation; and
the shifts coincide are performed based on a schedule of with change in the different data states not prohibited from having a verify test.

13. The apparatus of claim 11, wherein:
the set of data states has a number N data states; and
the subset has no more than a number N/2 data states.

14. The apparatus of claim 11, wherein:
for each sense circuit, the respective data transfer latch is external to the sense circuit and is configured to transfer data to and from the set of internal user data latches, and a local bus is configured to connect to the set of internal user data latches; and
another bus is configured to connect a sense circuit controller to the local bus and to the respective data transfer latch.

15. The apparatus of claim 11, wherein:
each set of bits of user data has M bits; and
for each sense circuit, one bit of the M bits is loaded into the respective data transfer latch and M−1 of the M bits are loaded into M−1 respective internal user data latches, one bit per internal user data latch.

16. A method of operating a memory system that includes a plurality of sense circuits, each sense circuit connected to a respective memory cell of a set of memory cells and each sense circuit including a set of internal user data latches connected to a respective external data transfer latch of each sense circuit, the method comprising:

loading user data into the respective external data transfer latch and the set of internal user data latches of each sense circuit to assign a data state of a set of data states to the respective memory cell in a program operation, each respective external data transfer latch comprising a first bit value for a subset of the set of data states and a second bit value for data states of the set of data states which are above the subset, the first bit value indicating a data state not prohibited from having a verify test and the second bit value indicating a data state prohibited from having a verify test; and at specified program loops of the program operation, shifting the subset to encompass higher data states of the set of data states, and flipping the second bit value to the first bit value for respective external data transfer latches for data states of the set of data states which become encompassed by the subset.

17. The method of claim 16, further comprising maintaining a schedule indicating a correspondence between data states to verify and a program loop number in the program operation.

18. The method of claim 16, further comprising accessing the respective external data latch a single time to set a bit of an internal data latch of a corresponding sense circuit at a start of multiple verify tests for a respective memory cell in a program loop of the program operation.

19. The method of claim 16, further comprising:

setting a bit in an internal latch of each sense circuit to indicate when the respective memory cell has passed a lockout verify test; and updating the set of internal data latches based on the internal latch when the respective memory cell has passed the lockout verify test.

20. The method of claim 16, wherein for each sense circuit, the internal latch in combination with the respective set of internal user data latches are configured to indicate, independently of the bit value of the respective external data transfer latch, that the respective memory cell has passed the lockout verify test for program completion.

* * * * *